United States Patent [19]
Rubens

[11] Patent Number: 5,157,350
[45] Date of Patent: Oct. 20, 1992

[54] ANALOG MULTIPLIERS

[76] Inventor: Harvey Rubens, 850 N. Vista St., Los Angeles, Calif. 90046

[21] Appl. No.: 786,054

[22] Filed: Oct. 31, 1991

[51] Int. Cl.⁵ .............................................. H03F 3/45
[52] U.S. Cl. ..................................... 330/254; 330/257
[58] Field of Search ........................ 330/254, 257, 284

[56] References Cited

U.S. PATENT DOCUMENTS

| | | | |
|---|---|---|---|
| 4,360,786 | 11/1982 | Rehfeldt | 330/257 |
| 4,701,719 | 10/1987 | Nagata | 330/257 |
| 5,089,789 | 2/1992 | Tran | 330/257 |

FOREIGN PATENT DOCUMENTS

| | | | |
|---|---|---|---|
| 53-75746 | 5/1978 | Japan | 330/254 |
| 55-63112 | 5/1980 | Japan | 330/254 |

Primary Examiner—Eugene R. LaRoche
Assistant Examiner—Tan Dinh

[57] ABSTRACT

Class A gain control systems having extremely good linearity and wide dynamic range, and suitable for monolithic integration, are described in embodiments realizing several classical multiplier functions such as voltage controlled attenuators, exponentially controlled multipliers and four quadrant multipliers. Two identical current steering circuits, each comprising a matched, emitter coupled pair of transistors, or effective transistors, are fed from an actively linearized input circuit which derives the required well balanced signals from a single ended or balanced input source, and current mirror circuits are used to subtract unwanted common mode products from the output signals.

51 Claims, 11 Drawing Sheets

ANALOG MULTIPLIERS

BACKGROUND OF THE INVENTION

This invention relates to electronic circuits used to control the gain or attenuation of an electronic signal and, in particular, to techniques for improving the performance of those circuits which operate in a mode known in the art as "class A" with respect to bandwidth, control feed-through, distortion, dynamic range and thermal stability when they are fabricated as monolithic integrated circuits. Such devices are commonly known as voltage controlled amplifiers (VCA's), voltage controlled attenuators (VCAtt's), automatic gain controls (AGC's) or electronic analog multipliers.

As used herein, the term "gain cell" refers to a circuit block for controlling the gain of an electronic signal and having at least one input terminal, one output terminal and one control terminal. Multipliers disclosed in early prior art utilized a simple gain cell comprising one emitter coupled, emitter driven pair of transistors, also known as a differential current steering circuit, wherein a signal current is supplied to an input terminal formed by the joined emitters of the transistor pair, and an output is derived from one or the other of the collectors of the pair, the magnitude of which is determined by a control voltage applied between the two transistor bases.

Multiplier circuits thus formed rely on two well established principles. The first states that, with the exception of small leakage currents, the sum of the currents out of the two collectors will always be equal to the current applied to the joined emitters, or stated as an equation, $$I_{IN} = I_{OUT1} + I_{OUT2}. \quad [1]$$

The second, known as the principle of "current steering", states that the current applied to the joined emitters of a differential pair will be distributed (steered) predictably between the collectors of the two transistors as determined by the control voltage applied between their bases. The ratio of the outputs from the two collectors is expressed by the equation $$\frac{I_{OUT1}}{I_{OUT2}} = \exp(V_c/V_t), \text{ where} \quad [2]$$

$V_c$ = the control signal between the transistor bases, and
$V_t$ = the semiconductor thermal voltage $kT/q = 26$ mV at 302 degrees Kelvin, and where
k is Boltzman's constant,
T is the temperature in degrees Kelvin, and
q is the charge on an electron.

As noted, two outputs are possible from this current steering circuit, one from each collector of the pair, and, since the total output current is constant, as the control voltage causes the signal to increase at one output, it is attenuated at the other. The actual polarity of the control voltage is dependent upon the polarity of the transistors comprising the gain cell as well as the base to which the control voltage is referred. For the convenience of further discussion, a positive value for $V_c$ shall be defined as causing loss or attenuation at the output of the multiplier.

The current gain of such gain cells, A, is defined by the ratio of the current from one of the outputs to the input current and is expressed by the equation $$A = \frac{I_{OUT}}{I_{IN}} = \frac{1}{1 + \exp(V_c/V_t)}. \quad [3]$$

One limitation associated with these simple a gain cells is that, since all of the transistors comprising such a gain cell are of one polarity, the input signal to it must likewise be unipolar. To accommodate a bipolar input signal, a D.C. bias equal to one half of the maximum allowable input signal current can be summed with the input signal, resulting in a composite signal which ranges between the minimum and maximum allowable unipolar input current.

A problem with this technique is that, as the gain of the circuit is varied, the D.C. bias present in the input signal is modulated along with the desired bipolar signal, resulting in the presence of an undesirable changing D.C. component in the output signal. Another problem with such gain cell topologies is the presence of significant levels of even order harmonic distortion products in the output signal.

More advanced circuits utilize matched pairs of current steering circuits, also called balanced or four transistor gain cells or gain quads. In such circuits, the corresponding bases of each transistor of each differential pair are joined such that the two differential pairs are controlled in tandem, and an output signal is derived as the difference of the two signals from the corresponding collectors of each differential pair.

The advantages of constructing gain control circuits using four transistor gain cells are well known in the art. One such advantage is that the second transistor pair provides a like changing D.C. value which can be subtracted from the output signal to cancel the above noted D.C. changes. Another improvement is realized when the input signal is applied differentially between the inputs of the two differential pairs and later combined differentially at the output. Then, the previously noted even order distortion products present in the output signal of each of the pairs are also canceled. These advantages are best realized when such circuits are fabricated as monolithic integrated circuits, which assures a higher degree of device matching than is otherwise possible. Further discussion of gain cells will refer only to these latter topologies.

When a signal is simply applied to the input of a gain cell, and an output is derived from one or the other output terminal, the circuit is known as a VCAtt or AGC attenuator. In the article, "An Integrated Wide Band Variable Gain Amplifier With Maximum Dynamic Range" (*IEEE Journal of Solid State Circuits*, Vol. SC-9, No. 4, Aug., 1974), Sansen and Meyer reported that distortion and noise in the balanced AGC are due primarily to the base resistance ($R_b$) of transistors of the gain quad. They further reported that, in the balanced AGC, for very low values of base resistance, the linearity of the output signal is determined almost exclusively by the linearity of the input current sources which drive each of the emitter coupled pairs. Since this base resistance also represents a linear error term in the otherwise logarithmic characteristic of a b-e junction, a lower value for $R_b$ is also desirable in order to realize a circuit which more closely adheres to the ideal control law described by equation [3]. Low base resistance can be achieved by fabricating so-called "large geometry" transistors having a large emitter area or by connecting several transistors of smaller geometry in parallel.

Typically, the input stage used in balanced gain cells of prior art comprises a base driven differential transistor pair to derive the required differential signal currents. This input topology suffers restricted dynamic range because the maximum amplitude of the input signal is severely limited before the onset of unacceptable levels of distortion. The inclusion of emitter resistors results in an input stage having controlled gain and lower distortion in each signal path. However, when such a stage is driven from an unbalanced input signal, it exhibits less than ideal symmetry between the two signals. This, in turn, reduces the desired cancellation of undesired harmonic products in the output of the multiplier.

Applicant's prior U.S. Pat. No. 4,155,047 describes a balanced AGC topology comprising gain cell transistors having very low base resistance in combination with a pair of highly linearized input current sources which overcomes most of these problems. In this circuit, each input transistor is configured as a common base circuit, and an input signal current and an appropriate bias current are summed into each of the emitters. The dynamic range of this input circuit is further increased by actively linearizing the b-e junction of each input transistor by placing it in the feedback loop of an operational amplifier circuit, thus allowing a much larger input signal to be applied to each half of the input stage without inducing distortion. This patent also cites the further advantage of idealizing the loads on the collectors of the gain controlling transistors to maintain constant performance over the operating range of the circuit. Circuits so constructed have demonstrated a dynamic range greater than 116 Db (20 Khz bandwidth) with worst case harmonic distortion less than 0.03 percent.

The only remaining drawback to this input circuit is that, in the case of a unbalanced input signal, additional circuitry must be employed to derive the required balanced, differential signals before they are applied to the input stage. Prior patents describing balanced AGC attenuator circuits and improvements thereon include U.S. Pat. Nos. 3,641,450 (Lunn), 3,684,9764 (Soloman et al), 3,999,141 (Cochran et al) and 4,471,320 (Frey).

Equation [3] reveals one disadvantage of the AGC attenuator topology in some applications, since the maximum current gain of the multiplier, itself, is unity. Stated otherwise, it exhibits only loss (attenuation) with respect to the input signal. Thus, when an application requires a maximum current gain greater than unity, an additional gain stage must follow the gain cell, which also amplifies noise and other unwanted residual artifacts inherent in the gain cell, itself, along with the output signal.

Another potential disadvantage of the AGC topology can be observed from equation [3] in that it describes a control law which is neither linear nor purely exponential. With a linear control law, a linear unit of change in the control signal causes a linear change in the gain of the circuit. However, in many applications, it is desirable that an exponential relationship exist between the control and signal inputs, wherein a linear unit of change in the control signal causes a ratiometric change in the amplitude of the output signal. For example, in audio applications, where the standard unit of relative loudness, the decibel (Db), is exponential in nature, it is functionally useful to control the relative gain of a circuit exponentially with a signal scaled in linear units, e.g. Db/volt. The gain of such a circuit is described by the equation $$A = \frac{I_{OUT}}{I_{IN}} = \frac{1}{\exp(V_c/V_t)}. \qquad [4]$$

Although both equations [3] and [4] derive from the well established logarithmic characteristic of the b-e junction of its component transistors, the presence of the "1+" term in equation [3] causes a departure from an exponential control characteristic for small values of attenuation in the AGC.

In addition to a functionally convenient control law, most circuits with the control law described by equation [4] have the further advantage that they can exhibit both gain and loss with respect to the input signal. Such circuits disclosed in the prior art are of the general type known as "log/antilog" VCA's. They are so named because they first derive the log of the input signal; they then sum a linear control voltage with this logged signal and then derive the antilog (exponent) of that sum, as expressed by the equation $$I_{OUT} = -\exp(\log I_{IN} + [V_c/V_t]). \qquad [5]$$

The minus sign appears in the above expression because, typically, the output signal current from these circuits is inverted with respect to the input signal. Prior patents describing the basic theory and operation of log/antilog VCA's and improvements thereon include U.S. Pat. Nos. 3,532,868 (Embley), 3,714,462 (Blackmer), 4,225,794 (Buff), 4,331,931 (Adams) and 4,341,962 (Buff).

In comparing the noise performance of AGC and log/antilog multipliers using gain cells with equal noise characteristics, the AGC circuit is inherently quieter in applications where a gain greater than unity is not required. This is because, in a log/antilog circuit, the noise component of the gain cell itself is fed back to the input of the circuit.

As shown in U.S. Pat. Nos. 4,331,929 (Yokoyama) and 4,341,962, previously cited, the noise performance of a gain cell can be improved by placing one or more diodes or diode-connected transistors in series with the emitter of each primary transistor of each pair to form a composite or "effective" transistor device. This has the effect of lowering the transconductance of the pair and, thereby, its noise contribution. Each such effective transistor behaves as a single device having the polarity of the primary transistor and an effective base-emitter (b-e) voltage equal to the sum of the b-e voltage of the primary transistor plus the b-e or diode voltage of each secondary device. Implicit in this technique is that the control voltage required to effect a given change in the gain of the circuit is also determined by this effective b-e voltage. For convenience, henceforth, the terms "transistor" and "effective transistor" may be used interchangeably to denote a single or a composite transistor device.

Many of the log/antilog VCA circuits cited above operate as "class B" or "class AB" circuits. In a class B circuit, positive and negative portions of the signal are processed by different devices or signal paths within the circuit, each of which is held out of conduction (turned off) when the opposite signal path is active, and both of which are turned off when no input signal is present. In a class AB circuit, each half of the circuit is biased slightly on to create a somewhat smoothed crossover region in which both halves of the circuit are active.

The disadvantages of class B and class AB operation are well documented in the prior art. These include crossover distortion and modulation noise. Another problem common to such circuits arises because, as each of the signal paths alternately turns on and off, their associated components correspondingly heat and cool. This results in signal induced thermal transients within the circuit which have been demonstrated to induce distortion products in the output signal. A further problem with these circuits arises because the amplitude of the input signal determines operating current within each path of the gain cell. Thus, when the input signal is very low in amplitude, the operating current in the transistors comprising the gain cell is also very low, which, in turn, has the effect of reducing the bandwidth of the circuit under low signal conditions.

In contrast, the present invention, as well as all of the AGC circuits and several of the latter log/antilog circuits in the above cited patents, operate as class A circuits, wherein sufficient D.C. bias is present on all of the transistors in the signal path that they remain in conduction under all normal conditions of operation. The advantages of class A operation include freedom from crossover distortion and signal induced thermal transients, as well as minimization of modulation noise, previously noted.

All of the cited class A circuits utilize two current steering circuits, each comprising a differential transistor pair. Furthermore, in all of the balanced AGC circuits and one of the log/antilog circuits, all of the effective transistors are of the same polarity. While this ensures close matching of the electrical characteristics of the two signal paths, the output signal is usually stated to be balanced, or differential, in nature. In most of the prior art, some means, such as a transformer or a differential amplifier, is then used to recombine the two outputs or otherwise obtain the desired cancellations in the output signal.

As shown in U.S. Pat. Nos. 4,004,141 (Curtis) and 4,331,929, previously cited, a circuit commonly used in the design of monolithic operational amplifiers and known in the art as a "current mirror" provides another means of converting the balanced output from a gain cell to a single-ended signal current while maintaining a idealized load on each output terminal.

The latter patent also illustrates another technique, common in operational amplifier design, wherein another transistor is connected in series with the input of each current mirror in what is know in the art as a "cascode" configuration. So connected, the base of each cascode transistor is biased such that its emitter is at or near ground. Thus, the collector of each transistor which is feeds the input of a current mirror operates under conditions similar to the corresponding device which is connected to a circuit output terminal.

Unlike the balanced AGC circuits of the prior art, all but one of the cited class A log/antilog circuits use dissimilar differential pairs in which the effective transistors comprising each pair opposite in polarity from those comprising the other. In such gain cells, the appropriate collectors from each of the pairs are simply tied together to form the output and feedback terminals of the gain cell, with signals in the form of currents having a quiescent value centered between the two power supplies.

In theory, this configuration maintains the advantages of canceling unwanted D.C. and even order harmonic products, and it has the advantage of providing an output signal which is more convenient to use in applications where it is desirable to sum the output from a number of such gain cells. A single ended current output signal also allows for a simpler realization of such functions as some forms of electronically controlled filter circuits.

Although, for any given gain condition, these circuits do not exhibit the transient distortion problems of class B and class AB designs, the unmatched characteristics of their dissimilar devices typically cause other errors in the output signal. These errors occur for two reasons:

First, as the gain of the multiplier changes in response to a control signal, electrical dissimilarities in the unlike devices can cause the control characteristic of one of the current steering circuits not to match that of the other. Second, as more or less current is steered to the output or feedback terminal through each path of the gain cell, relative heating and cooling of the dissimilar devices occurs, resulting in thermally induced mismatches between the two signal paths. Under such conditions, the otherwise complementary error components present in each half of the circuit do not cancel when the two outputs are recombined.

One such error is a shift in the D.C. base line of the output signal, either as the gain of the circuit is varied or in response to external thermal changes, resulting in "control feed-through", an undesirable artifact in the output signal in response to changes in the control signal. Another such error is thermally induced static or transient residual distortion products in the output signal. Although many of these errors can be trimmed out for a limited range of operating conditions, no means is presently available to cause even monolithic transistors of opposite polarity to track each other perfectly under all electrical and thermal conditions of operation.

When an AGC attenuator is included in the feedback loop of an operational gain circuit, the "1+" term in equation [3] drops out, and a class A multiplier having a purely exponential gain control law is realized. This is shown as follows:

If the signal I $_{OUT\,1}$ from output 1 is returned to the inverting input of the input stage as feedback current I $_{FB}$, and the signal I $_{OUT\,2}$ from output 2 is defined as output signal I $_{OUT}$, then $$I_{OUT\,1} = I_{FB} = -I_{IN}, \text{ and} \quad [6]$$

$$I_{OUT\,2} = I_{OUT}. \quad [7]$$

Substituting equations [6] and [7] in equation [2], $$\frac{-I_{IN}}{I_{OUT}} = \exp(V_c/V_t). \quad [8]$$

Inverting both sides of the equation gives $$\frac{I_{OUT}}{-I_{IN}} = \frac{1}{\exp(V_c/V_t)}, \quad [9]$$

which is the same as equation [4], except for the minus sign, and is the desired result, referred to equation [5]. As will be shown in the preferred embodiments, with minor modification, it is further possible to derive an output signal current which is non-inverted with respect to the input signal.

These circuits avoid the cited problems associated with gain cells comprising dissimilar devices. However, operational circuits rely on negative feedback to reduce any distortion generated within the circuit, itself. The amount by which this internal (open loop) distortion can be reduced is a function of the difference between the open loop and closed loop gain of the circuit, which, in these circuits, varies as a function of the instantaneous gain of the multiplier, and by any delays which may exist in the feedback path. Such delays also pose constraints on the high frequency stability and the transient performance that can be attained by the circuit. Thus, the performance of the multiplier circuits shown in the prior art is limited by the open loop distortion, noise and bandwidth characteristics of the gain cell, itself.

If one of the two output signals from a balanced AGC attenuator is subtracted from the other, the resulting output signal current ranges between $+I_{IN}$ and $-I_{IN}$ as the control signal goes from $+V_c$ max to $-V_c$ max. Furthermore, since the signal from each path of the gain cell is equal to, and opposite in polarity from the other, when $V_c=0$, the resulting output signal current also equals 0.

This control transfer function can be easily obtained by cross-connecting the respective first and second output terminals from one current steering circuit to the respective second and first output terminals of the second. This connection describes a third multiplier circuit commonly know as a four quadrant multiplier or balanced modulator demodulator, the gain of which is described by the equation $$A = \frac{I_{OUT}}{I_{IN}} = (1 + \exp[V_c/V_t]) - \frac{1}{(1 + \exp[V_c/V_t])} \quad [10]$$

Although equation [10] is highly nonlinear, such multipliers are widely used in applications such as phase detectors in phase locked loops and in various frequency and amplitude modulation and demodulation circuits. Also, with additional linearizing circuitry, the control function of a four quadrant multiplier can be made to be highly linear and independent of temperature. Such techniques are described by Barrie Gilbert in "A Precise Four-Quadrant Multiplier with Subnanosecond Response" (*IEEE Journal of Solid State Circuits*, Vol. SC-3, No. 4, Dec., 1968).

It has been shown that a balanced AGC attenuator, an exponentially controlled multiplier and a four quadrant multiplier all can be implemented as applications of the same basic balanced gain cell. It is the specific method of interconnecting the gain cell with its surrounding circuitry that determines which type of multiplier is realized. Therefore, improvements in the performance of the gain cell, itself, over prior art now result in improvements in the performance of all of these types of multiplier circuits.

SUMMARY OF THE INVENTION

The present invention takes note of the fact that, while it is desirable to employ well balanced, highly linearized current sources for each signal path of a balanced gain cell, the input stages shown in prior art have required separate circuitry to balance and to linearize the signal paths when fed from an unbalanced signal source. Conversely, when the gain cell is to be included in the feedback loop of an operational circuit, it is desirable that the input circuitry comprises a minimum number of sequential stages so that it imparts minimal delay on the signal path. Also, while it is very difficult to construct perfectly matched current steering circuits comprising dissimilar effective transistors, it is well known in the art that a current mirror can be easily constructed to take advantage of the inherent matching of monolithic devices of like polarity.

Accordingly, in each of the embodiments of this invention, there is described a gain cell of the general type comprising two matched current steering circuits, each, in turn, comprising four transistors, or effective transistors, of the same polarity which are connected as a first and a second emitter coupled, emitter driven current steering circuit. Preferably, all of the transistors comprising the current steering circuits are on the same substrate (monolithic) for good thermal tracking and are devices having a very low base resistance for low noise, low distortion and good control law conformity.

The input of each emitter coupled pair is fed from an input stage having controlled gain which is adapted to receive an input signal and to provide a first and a second output current, each comprising the sum of a signal component and a D.C. bias current sufficient to hold the circuit in conduction under all normal conditions of operation.

Each signal path of the input stage is actively linearized to provide a signal component having very low distortion which is proportional to the input signal the input signal and each of which is equal in amplitude to, and opposite in polarity from, the other, irrespective of whether the input signal is balanced or single-ended.

The bases of the first transistor of each current steering circuit are connected to each other and to a first system control terminal, and the bases of the second transistor of each current steering circuit are connected to each other and to a second system control terminal, and a control signal is applied between the system control terminals.

The collector of the first transistor of the first current steering circuit is connected to the input of a first current mirror, and the collector of the first transistor of the second current steering circuit is connected to the output of this first current mirror and to a first system output terminal.

Similarly, for the exponentially controlled multiplier and for the AGC attenuator having two outputs, the collector of the second transistor of the first current steering circuit is connected to the input of a second current mirror, and the collector of the second transistor of the second current steering circuit is connected to the output of this second current mirror and to a second system output terminal. Where a second output signal is not required, the collectors of the respective second transistors of each current steering circuit are connected to signal ground or to the appropriate voltage supply terminal.

For the four quadrant multiplier, the collector of the first transistor of the first current steering circuit is connected to the collector of the second transistor of the second current steering circuit and to the input of a current mirror, and the collector of the second transistor of the first current steering circuit is connected to the collector of the first transistor of the second current steering circuit and to the output of the current mirror and also to a system output terminal.

Even when the transistors comprising the current steering circuits are monolithic and are designed with great care, some finite offset may exist between them. When the output signals from each current steering circuit are combined, this offset can degrade the cancellation of quiescent current $I_Q$, resulting in a shift in the D.C. base line in the system output signal. Thus, in all of its embodiments, although the respective system control terminals of the two current steering circuits are described as being connected and controlled in tandem, it is considered desirable and within the scope of this invention to provide a means whereby an offset correcting voltage can be applied to the control terminal of one current steering circuit with respect to the other.

In all of the embodiments of this invention, each transistor from which an output signal is derived typically operates with zero voltage potential between the collector and base, since its collector is connected to a virtual ground such as the inverting input of a ground referenced operational amplifier. However, each collector of the remaining transistors in the gain cell is connected to the input terminal of a current mirror. This difference in the operating conditions of the corresponding transistors comprising each gain cell can be a source of offset or distortion in the output signal. Thus, it is considered desirable and within the scope of this invention to provide a means whereby each transistor in one current steering circuit operates under the same condition as the corresponding transistor in the opposite gain cell of the circuit.

Preferably, all of the transistors comprising each current mirror are fabricated on the same substrate for good thermal tracking. These transistors need not match or thermally track the transistors comprising the gain cell. It is sufficient that each current mirror accurately reflects the current applied to it over a wide operating range, independent of temperature or supply voltage.

In operation, the output signal from each current mirror behaves as if it were an output signal from a differential pair comprising transistors opposite in polarity from the second differential pair to which it is connected. Yet, each such signal current is actually a voltage and temperature independent linear mirror image of the output signal from the first differential pair which drives it. This results in a gain cell having the desired output characteristics of a circuit comprising dissimilar devices while having all of the advantages of one comprising all matched, like transistors.

Although the signal current from each output terminal of this invention is truly bipolar, like the cited log/antilog circuits, it cannot be directly converted to a voltage by simply connecting a resistor from the output terminal to ground, since this would require the transistors comprising the gain cell to operate with a reverse biased collector-base junction for one half of its potential output range. In practice, this presents no problem, since the output terminal typically is connected directly to a virtual ground such as is formed at the inverting input of an operational amplifier. However, it is contemplated within the scope of this invention that a current output terminal capable of so developing a bipolar voltage could be realized with the addition of two more current mirrors for each such required output terminal.

When the present invention is applied as an AGC attenuator or a four quadrant multiplier, the input stage is configured to take fixed voltage gain such that, in response to a the maximum anticipated input signal, the amplitude of each signal component out of this stage will be equal to the maximum current handling capability of each path in the gain cell. When so applied, the signal and control performance of the multiplier will be defined solely by the performance of the unipolar, balanced differential gain cell which forms its core.

When this invention is applied to realize a multiplier having an exponential control characteristic, it can be regarded as an inverting amplifier circuit having voltage controlled feedback current. In this embodiment, an AGC attenuator circuit having two outputs is considered as a gain cell which is included within the feedback loop of the added amplifier stage.

A signal current is applied to the input. The output signal from this first gain stage is applied to the input of the gain cell such that one output terminal provides a feedback signal which is inverted with respect to the input signal, and an output signal current is derived from the second output terminal. The combined circuitry is then analogous to the first and second gain stages of a classical operational amplifier circuit, and the desired gain for the second stage can be determined using standard I.C. design procedures.

When so configured, the linearized second gain stage of the circuit contributes no distortion to the signal, and only the residual distortion of the first gain stage remains to be corrected by negative feedback. Thus, distortion of the output signal of this multiplier is significantly less dependent on global negative feedback, and this embodiment of the invention provides a multiplier having lower distortion and improved dynamic range and stability over a wider range of gain control than the log/antilog multipliers disclosed in the prior art.

An object of the present invention is to provide a new and improved class A gain cell topology suited for implementing AGC attenuator circuits, multipliers having an exponential gain control law and four quadrant multipliers, which overcome the limitations cited in the prior art with regard to distortion, noise, bandwidth, control feed-through and thermal stability.

Another object of this invention is to provide a gain cell topology for these multiplier circuits in which the inherent dissimilarities of the characteristics of the unlike transistor devices comprising the circuit do not affect its performance.

A further object of this invention is to provide a gain cell topology suitable for monolithic integration, and, thereby, to ensure tight matching of the like transistors in the circuit.

Yet another object of this invention is to provide improved multiplier circuits which are easier to use in most applications by providing a single ended current output, similar to the cited class A log/antilog circuits, wherein the current steering circuits of each gain cell comprise transistors or effective transistors all of the same polarity.

DESCRIPTION OF THE PREFERRED EMBODIMENTS

Throughout the drawings, like numerals are used to describe like parts. Also, all points described as connected to a designated point such as voltage source $+V$ or $-V$ are to be regarded as being connected to the same designated point.

Figure 1:
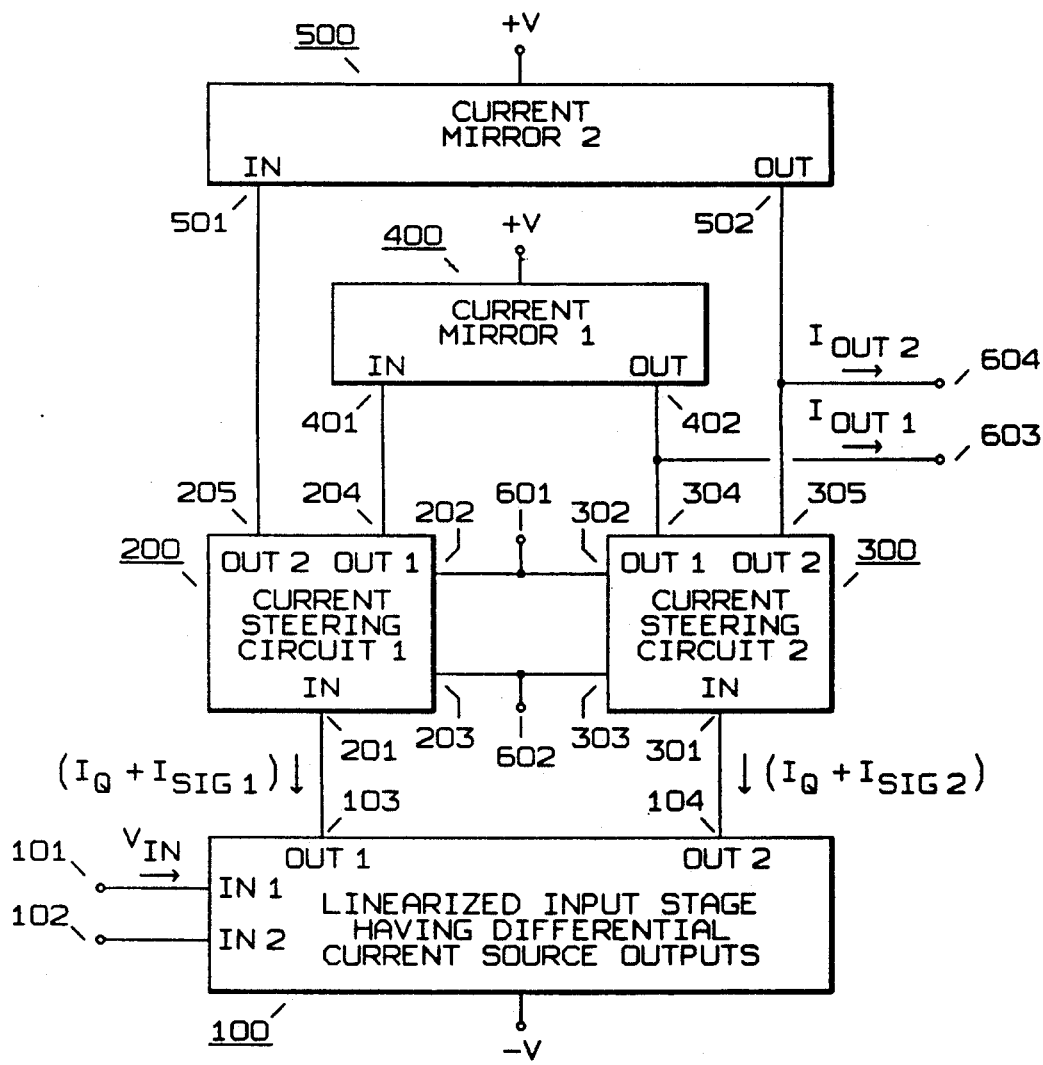
FIG. 1 is a block diagram of an improved voltage controlled attenuator constructed according to the present invention.

FIG. 1 shows a block diagram of the invention configured as an AGC attenuator comprising input stage 100, a first and a second current steering circuit 200 and 300, respectively, a first and a second current mirror 400 and 500, respectively, a first and a second system control terminal 601 and 602 respectively and a first and a second system output terminal 603 and 604, respectively.

In FIG. 1, input stage 100 comprises input terminal 101, a first and a second output terminal 103 and 104, and a connection to negative voltage source $-V$. Input stage 100 optionally may include additional input terminals such as indicated at 102.

Current steering circuit 200 comprises input terminal 201, a first and a second output terminal, 204 and 205, respectively and a first and a second control terminal, 202 and 203, respectively. Similarly, current steering circuit 300 comprises input terminal 301, a first and a second output terminal, 304 and 305, respectively and a first and a second control terminal, 302 and 303, respectively.

Current mirror 400 comprises an input terminal 401, an output terminal 402 and a connection to positive voltage source $+V$. Likewise, current mirror 500 comprises an input terminal 501, an output terminal 502 and a connection to $+V$.

Input stage 100 is an amplifier circuit having determinable voltage gain. When an input signal $V_{IN}$ is applied to any input terminal, input stage 100 develops complimentary first and second signal currents $I_{SIG\,1}$ and $I_{SIG\,2}$, respectively, each of which is proportional to input signal $V_{IN}$ and equal in amplitude to, and opposite in polarity from the other, as expressed by the equation $$I_{SIG\,1} = I_{SIG\,2} = \pm I_{SIG}.\qquad [11]$$

In practice, it may be desirable to derive a final output signal which is either inverted or non-inverted with respect to input signal $V_{IN}$. To this end, input stage may comprise a circuit configured so that either $I_{SIG\,1}$ or $I_{SIG\,2}$ is of the same polarity as input signal $V_{IN}$.

Input stage 100 also provides a means to sum a D.C. bias current $I_Q$ with $I_{SIG\,1}$ and with $I_{SIG\,2}$ to derive a first and a second output signal current $(I_Q + I_{SIG\,1})$ and $(I_Q + I_{SIG\,2})$, respectively, from output terminals 103 and 104. Typically, $I_Q$ is set equal to the maximum anticipated amplitude of $I_{SIG}$ to bias the input stage into class A operation. However, other biasing conditions are possible and are contemplated as being within the scope of this invention.

Output terminal 103 is connected to input terminal 201 of current steering circuit 200, and output terminal 104 is connected to input terminal 301 of current steering circuit 300.

Current steering circuit 200 is a circuit configured to distribute or steer the input signal applied to input terminal 201 between output terminals 204 and 205 in a manner determined by a control voltage applied between control terminal control terminals 202 and 203. Likewise, current steering circuit 300 is a circuit configured to distribute or steer the input signal applied to input terminal 301 between output terminals 304 and 305 in a manner determined by a control voltage applied between control terminals 302 and 303.

Control terminal 202 of current steering circuit 200 is connected to control terminal 302 of current steering circuit 300 and to first system control terminal 601. Likewise, control terminal 203 of current steering circuit 200 is connected to control terminal 303 of current steering circuit 300 and to second system control terminal 602. Thus, when a control voltage is applied between system control terminals 601 and 602, the two current steering circuits are controlled in tandem. Further means may be added to the control circuit to allow trimming out finite offsets which may exist between the two current steering circuits.

Output terminal 204 from current steering circuit 200 is connected to input terminal 401 of current mirror 400. Similarly, output terminal 205 from current steering circuit 200 is connected to input terminal 501 of current mirror 500.

Current mirrors 400 and 500 are specified as having a gain of unity over a wide range of input current and operating temperature. The output from such a current mirror is defined as being equal to, and opposite in polarity from, the current applied to its input. Thus, the currents from output terminals 402 and 502 are expressed by the equations $$I_{OUT\,(402)} = -I_{IN\,(401)}, \text{ and} \qquad [12]$$

$$I_{OUT\,(502)} = -I_{IN\,(501)}. \qquad [13]$$

Output terminal 402 from current mirror 400 is connected to output terminal 304 from current steering circuit 300 at system output terminal 603. Likewise, output terminal 502 from current mirror 500 is connected to output terminal 305 from current steering circuit 300 at output terminal 604. When only one system output terminal is required, current mirror 500 may be omitted. Output terminals 205 and 305 from current steering circuits 200 and 300, respectively, are then connected to +V or to signal ground.

Figure 2:
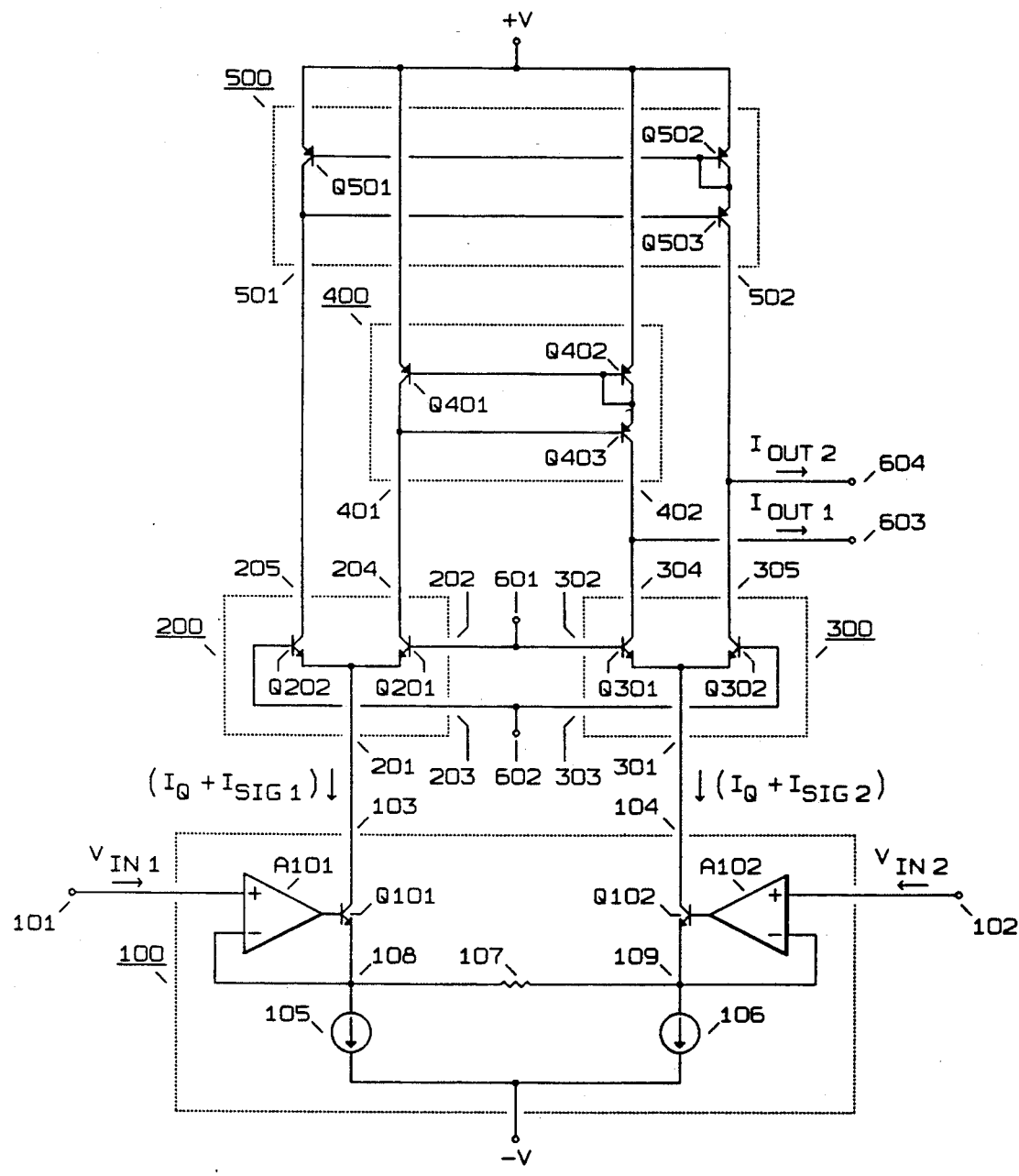
FIG. 2 is a schematic diagram showing a first preferred embodiment of the invention according to FIG. 1.

FIG. 2 shows a schematic of a preferred embodiment of the voltage controlled attenuator described in block form in FIG. 1. In FIG. 2, input circuit 100 comprises a first and a second operational amplifier A101 and A102, respectively, a first and a second NPN transistor Q101 and Q102, respectively, a first and a second constant current source 105 and 106, respectively and a gain determining resistor 107 in addition to the features previously described.

Input terminal 101 is connected to the non-inverting input of A101, and input terminal 102 is connected to the non-inverting input of A102. The collectors of Q101 and Q102 are connected to output terminals 103 and 104, respectively. The circuit functions as a precision voltage to current converter which derives the previously described first and second output signals ($I_Q+I_{SIG1}$), and ($I_Q+I_{SIG2}$), in response to input signal $V_{IN}$.

Operational amplifier A101 is configured as a voltage follower which includes the base-emitter (b-e) junction of transistor Q101 within its feedback loop such that the output of A101 is connected to the base of Q101, and the emitter of Q101 is connected to the inverting input of A101 at summing junction 108. Operational amplifier A102 is likewise configured as a voltage follower which includes the b-e junction of transistor Q102 within its feedback loop such that the output of A102 is connected to the base of Q102, and the emitter of Q101 is connected to the inverting input of A102 at summing junction 109. Current sources 105 and 106 are connected to summing junctions 108 and 109, respectively, and each is also connected to −V. Gain determining resistor 107 is connected between summing junctions 108 and 109.

The open loop gain of an operational amplifier having a closed feedback loop causes the circuit to output whatever voltage is required to force the voltage at its inverting input to the same voltage as is present at its non-inverting input. Constant current sources 105 and 106 each provide a quiescent current $I_Q$ to junctions 108 and 109, respectively, which is sufficient to hold the respective b-e junctions of Q101 and Q102 in conduction under all normal conditions of operation. Thus, the voltage at the emitter of Q101 is forced to the same voltage as is present at the non-inverting input of A101, and the voltage at the emitter of Q102 is forced to the same voltage as is present at the non-inverting input of A102.

Input circuit 100 is configured to receive a differential input signal in which $V_{IN}$ is defined as the difference between first and second input signals $V_{IN1}$ and $V_{IN2}$, which are applied to input terminals 101 and 102, respectively. Thus, $$V_{IN}=V_{IN1}-V_{IN2}. \quad [14]$$

$V_{IN1}$ and $V_{IN2}$ may be any D.C. or A.C. voltage within the operating limits of the circuit. For the circuit shown, the negative input voltage limit is determined by the saturation voltage of current sources 105 and 106, and the positive limit is determined by the voltage at input terminals 201 and 301 of first and second current steering circuits 200 and 300, respectively.

When $V_{IN1}=V_{IN2}$, the voltages at junction 108 and 109 are also equal ($V_{IN}=0$), no current flows through resistor 107, and only quiescent current $I_Q$ from current sources 105 and 106 flows through Q101 and Q102, respectively. However, when the difference between $V_{IN1}$ and $V_{IN2}$ forces the voltage at junction 108 more positive or more negative than the voltage at junction 109, signal current $\pm I_{SIG}$ flows through resistor 107.

When $V_{IN1}$ is more positive than $V_{IN2}$, current from current source 106 is drawn through resistor 107 and summed with quiescent current $I_Q$ from current source 105 at summing junction 108. This current flows through Q101 and out of its collector at output terminal 103. The remainder of the current from current source 106 flows through Q102 and out of its collector at output terminal 104.

Conversely, when $V_{IN1}$ is more negative than $V_{IN2}$, current from current source 105 is drawn through resistor 107 and summed with quiescent current $I_Q$ from current source 106 at summing junction 109. This current flows through Q102 and out of its collector at output terminal 104. The remainder of the current from current source 105 flows through Q101 from the collector of Q101 at output terminal 103.

The conversion of input signal $V_{IN}$ to signal current $I_{SIG}$ is expressed by the equation $$I_{SIG} = \frac{V_{IN}}{\text{Resistor }107} . \quad [15]$$

In this circuit, the maximum value of $I_{SIG}$ is $\pm I_Q$. The voltage gain $A_V$ of the circuit, set by Resistor 107 reflects the efficiency of conversion and is expressed by the equation $$A_V = \frac{V_{IN}}{\text{Resistor }107\,(I_Q)} . \quad [16]$$

For the circuit shown, the $I_{SIG}$ components of the currents at output terminal 103 and 104 are inverted and non-inverted, respectively, with respect to $V_{IN}$. Thus, $$I_{OUT(103)}=I_Q+I_{SIG1}=-I_{SIG}, \text{ and} \quad [17]$$

$$I_{OUT(104)}=I_Q+I_{SIG2}=+I_{SIG}. \quad [18]$$

Current steering circuit 200 comprises an emitter coupled differential pair of NPN bipolar transistors Q201 and Q202 wherein the emitter of Q201 is connected to the emitter of Q202 and to input terminal 201, the bases of Q201 and Q202 are connected to a first and a second control terminal 202 and 203, respectively, and the collectors of Q201 and Q202 are connected to a first and a second output terminal 204 and 205, respectively. Likewise, current steering circuit 300 comprises an emitter coupled differential pair of NPN bipolar transistors Q301 and Q302 wherein the emitter of Q301 is connected to the emitter of Q302 and to input terminal 301, the bases of Q301 and Q302 are connected to a first and a second control terminal 302 and 303, respectively, and the collectors of Q301 and Q302 are connected to a first and a second output terminal 304 and 305, respectively.

When a control voltage is applied between control terminals 601 and 602, differential current steering circuits 200 and 300 are operated in tandem such that the signal at input terminal 201 is steered between output terminals 204 and 205, and the signal at input terminal 301 is steered between output terminals 304 and 305, as previously described. Defining $V_c$ as the voltage at control terminal 601 relative to the voltage at control terminal 602, the signals at output terminals 204 and 304 are described by the equations $$I_{OUT(204)} = (I_Q + I_{SIG\,1})(1 + \exp[V_c/V_t]), \text{ and} \quad [19]$$

$$I_{OUT(304)} = (I_Q + I_{SIG\,2})(1 + \exp[V_c/V_t]). \quad [20]$$

The signals at output terminals 205 and 305 are then described by the equations $$I_{OUT(205)} = \frac{I_Q + I_{SIG\,1}}{1 + \exp(V_c/V_t)}, \quad [21]$$

and $$I_{OUT(305)} = \frac{I_Q + I_{SIG\,2}}{1 + \exp(V_c/V_t)}. \quad [22]$$

Substituting $-I_{SIG}$ for $I_{SIG\,1}$ and $+I_{SIG}$ for $I_{SIG\,2}$ in equations [21] and [22], $$I_{OUT(204)} = (I_Q - I_{SIG})(1 + \exp[V_c/V_t]), \quad [23]$$

$$I_{OUT(304)} = (I_Q + I_{SIG})(1 + \exp[V_c/V_t]), \quad [24]$$

$$I_{OUT(205)} = \frac{I_Q - I_{SIG}}{1 + \exp(V_c/V_t)}, \quad [25]$$

and $$I_{OUT(305)} = \frac{I_Q + I_{SIG}}{1 + \exp(V_c/V_t)}. \quad [26]$$

Current mirror 400 comprises a first, a second and a third PNP bipolar transistor Q401, Q402 and Q403, respectively. Likewise, current mirror 500 comprises a first, a second and a third PNP bipolar transistor Q501, Q502 and Q503, respectively.

In current mirror 400, the emitters of Q401 and Q402 are connected to +V. The base of Q401 is connected to the joined base and collector of Q402 and to the emitter of Q403. The collector of Q401 is connected to the base of Q403 at input terminal 401. The collector of Q403 is connected to output terminal 402. Similarly, in current mirror 500, the emitters of Q501 and Q502 are connected to +V. The base of Q501 is connected to the joined base and collector of Q502 and to the emitter of Q503. The collector of Q501 is connected to the base of Q503, at input terminal 501. The collector of Q503 is connected to output terminal 502.

Thus configured, the respective components comprising current mirrors 400 and 500 each form a circuit known in the art as a Wilson current mirror. However, it is contemplated within the scope of this invention that other current mirror circuits having sufficient linearity and compliance exist and could be substituted for the specific topology shown.

The signal currents from respective output terminals 402 and 502 are expressed by the equations $$I_{OUT(402)} = -(I_Q - I_{SIG})(1 + \exp[V_c/V_t]), \quad [27]$$

and $$I_{OUT(502)} = \frac{-(I_Q - I_{SIG})(1 + \exp[V_c/V_t])}{1 + \exp(V_c/V_t)}. \quad [28]$$

When $I_{OUT(402)}$ is summed with $I_{OUT(304)}$, the $I_Q$ term is canceled, and output signal $I_{OUT\,1}$ at system output terminal 603 is expressed by the equation $$I_{OUT\,1} = 2(I_{SIG})(1 + \exp[V_c/V_t]). \quad [29]$$

Similarly, when $I_{OUT(502)}$ is summed with $I_{OUT(305)}$, and like terms are combined, the $I_Q$ term is canceled, and the resulting output signal $I_{OUT\,1}$ at system output terminal 604 is expressed by the equation $$I_{OUT\,2} = \frac{2(I_{SIG})}{1 + \exp(V_c/V_t)}. \quad [30]$$

Figure 3:
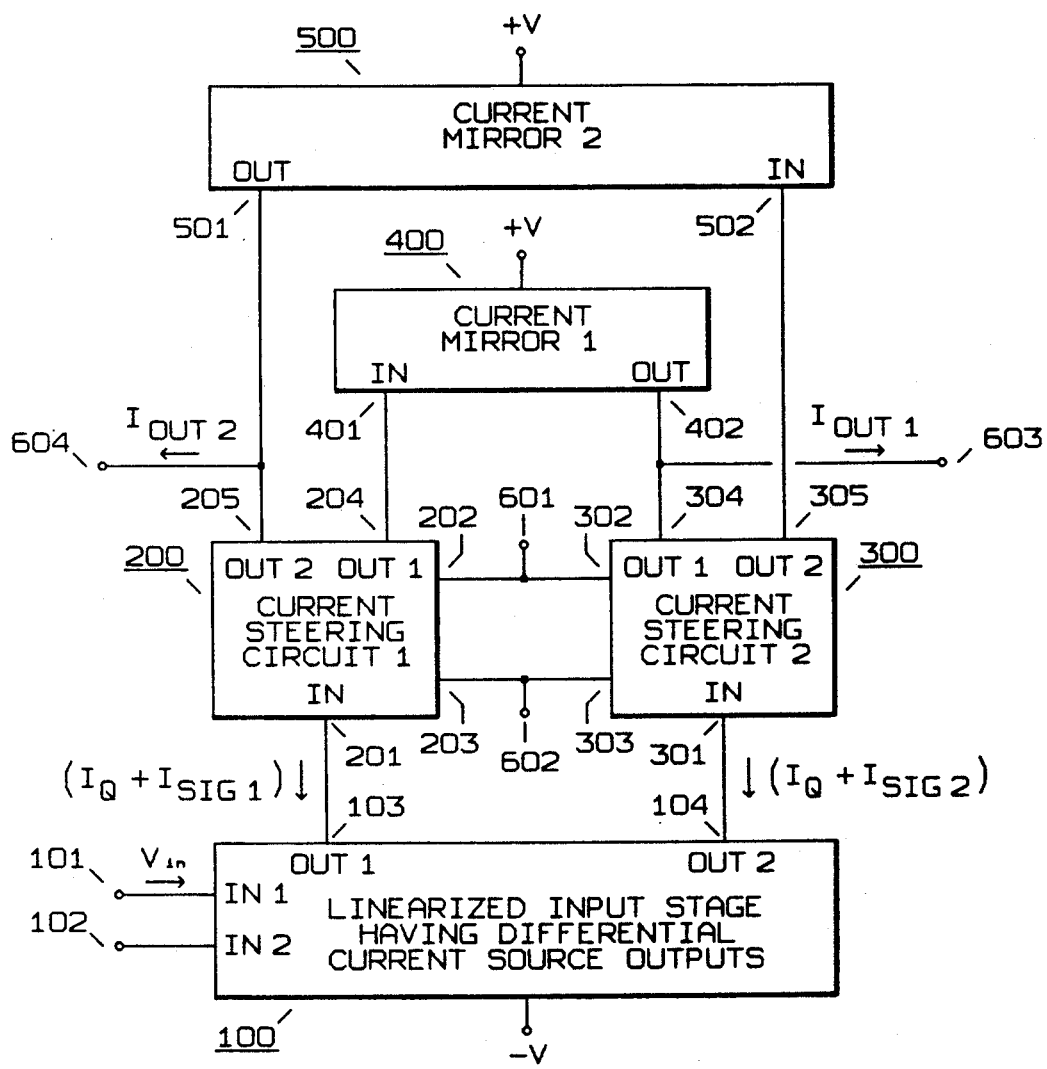
FIG. 3 is a block diagram of a second attenuator circuit which is similar to FIG. 1, except that the first and second output signal currents are opposite in polarity from each other.

FIG. 3 shows a block diagram of the invention configured as a second voltage controlled attenuator which is similar to the embodiment described in FIG. 1, except that the first and second output signal currents are opposite in polarity from each other. This embodiment comprises the same components described in FIG. 1. However, in FIG. 3, the connections to the input and output terminals of second current mirror 500 are reversed such that second output terminal 305 from current steering circuit 300 is connected to input terminal 501 of current mirror 500, and second output terminal 205 from current steering circuit 200 is connected to output terminal 502 of current mirror 500. Second output signal current $I_{OUT\,2}$ is then derived from system output terminal 604 at the junction of output terminal 205 of current steering circuit 200 and output terminal 501 of current mirror 500.

So configured, when $I_{SIG(305)}$ from equation [26] is applied to input terminal 501 of current mirror 500, the signal at output terminal 502 is expressed by $$I_{OUT(502)} = \frac{(I_Q - I_{SIG})(1 + \exp[V_c/V_t])}{1 + \exp(V_c/V_t)}. \quad [31]$$

Summing equations [25] and [31], the output at 604 is now expressed by $$I_{OUT\,2} = \frac{-2(I_{SIG})}{1 + \exp(V_c/V_t)}, \quad [32]$$

which is the same as equation [30], except for its inverted polarity.

Figure 4:
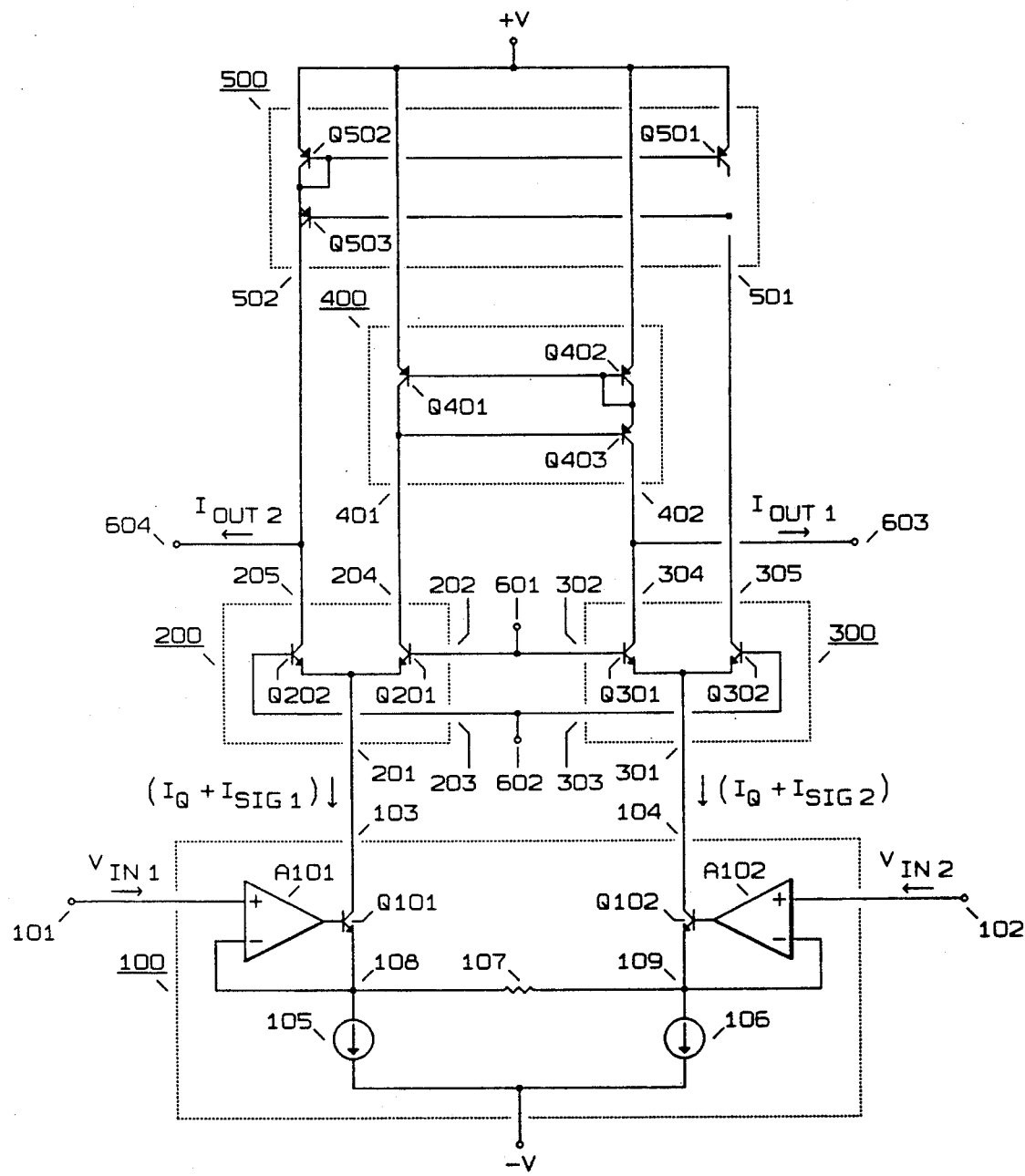
FIG. 4 is a schematic diagram showing a second preferred embodiment of the invention according to FIG. 3.

FIG. 4 shows a schematic diagram of a preferred embodiment of the voltage controlled attenuator described in FIG. 3. It is identical in form and function to the embodiment described in FIG. 2, with the exceptions noted in FIG. 3.

Figure 5:
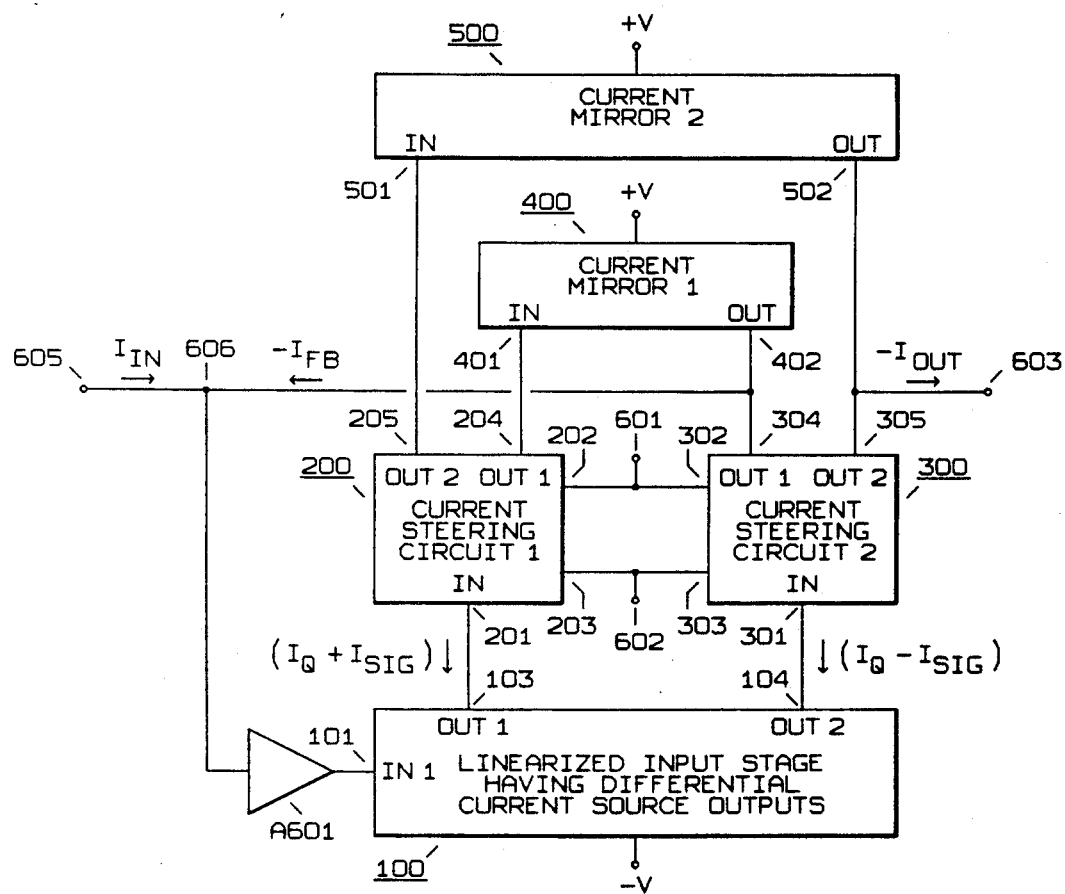
FIG. 5 is a block diagram of the invention wherein the gain cell of FIG. 1 is included in the feedback loop of an amplifier stage having substantial gain to realize an improved multiplier having an exponential gain control characteristic.

FIG. 5 shows a block diagram of the invention configured as a voltage controlled amplifier having an exponential control law. As shown in FIG. 5, this is accomplished by placing the embodiment of the invention described in FIG. 1 in the feedback loop of an operational gain stage.

In addition to the features previously described in FIG. 1, FIG. 5 includes system input terminal 605, system summing junction 606 and a first gain stage A601 having substantial open loop gain, and including a first and a second input terminal, which are inverting and non-inverting, respectively, and at least one output terminal. The polarity of the input terminals of A601 is designated with respect to the signal current from first system output terminal 603. Input stage 100 is redesignated as second gain stage 100, first output signal current I $_{OUT1}$ is redesignated as feedback current −I $_{FB}$, and second output signal current is redesignated as output current −I $_{OUT}$.

In FIG. 5, system input terminal 605 is connected to the inverting input of gain stage A601 and to first system output terminal 603 at summing junction 606. The non-inverting input of A601 is connected to a reference voltage such as ground, and the output of A601 is connected to input terminal 101 of second gain stage 100.

In operation, when a control voltage is applied between system control terminals 601 and 602 which causes the gain cell to attenuate feedback current −I $_{FB}$ at output terminal 603 and to increase output signal −I $_{OUT}$ at output terminal 604, the gain of the system increases. Conversely, when a control voltage is applied which causes the gain cell to increase feedback current −I $_{FB}$ and to attenuate output signal −I $_{OUT}$, the gain of the system decreases.

Figure 6:
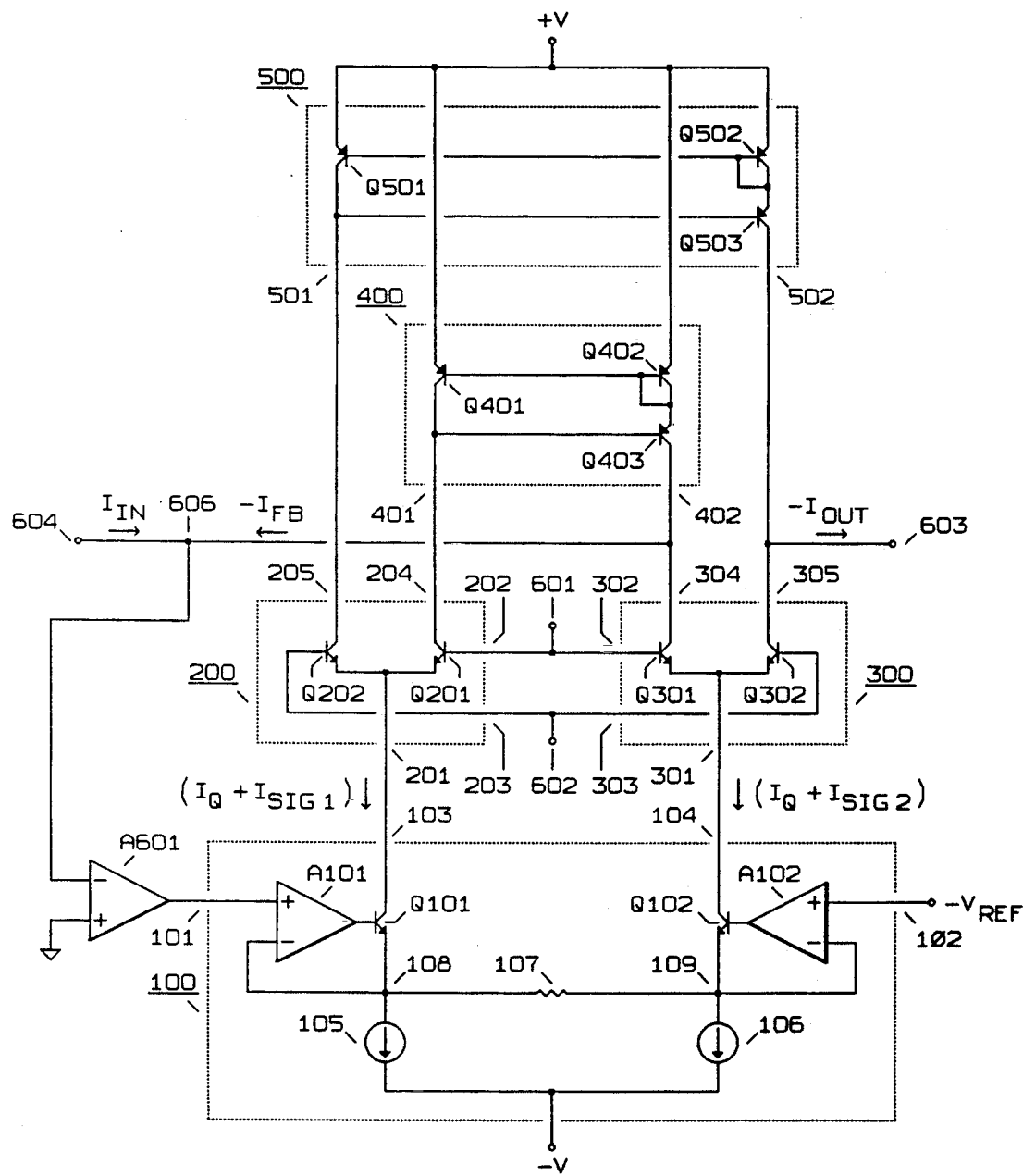
FIG. 6 is a schematic diagram showing a third preferred embodiment of the invention according to FIG. 5.

FIG. 6 shows a schematic of a preferred embodiment of the exponentially controlled multiplier described in block form in FIG. 5. In FIG. 6, the combination of A601 and second gain stage 100 function in a manner analogous to the first and second gain stages of a classical operational amplifier. Thus, in practice, the design of A601 would be simplified to that of the input stage of a operational amplifier, and the gain of second stage 100 would be determined by conventional design procedures, which, in turn, improves the performance of the circuit.

The inverting input of A601 is connected to system input terminal 601 and to first system output terminal 603 at summing junction 606, and the non-inverting input of A601 is connected to a reference voltage such as ground. The output of A601 is connected to input terminal 101 of second gain stage 100.

When input signal current I $_{IN}$ is applied to input terminal 605 and to the inverting input of operational gain stage A601, A601 develops an inverted signal at its output which is fed to input terminal 101 of second gain stage 100 and to the non-inverting input of operational amplifier A101. The non-inverting input of A102 is connected to an appropriate voltage reference, typically −V/2. Alternatively, A601 may be configured having two outputs, which are inverted and non-inverted, respectively, with respect to input signal I $_{IN}$, which are then applied to input terminals 101 and 102 of second gain stage 100, respectively.

As shown previously, second gain stage 100 develops differential output signals (I $_Q$+I $_{SIG}$) and (I $_Q$−I $_{SIG}$) at output terminals 103 and 104, the signal components of which are actively linearized and well matched for amplitude. Since input sage 100 is also capable of taking gain, A601 may be simpler than a complete conventional operational amplifier. As applied in this embodiment, A601 may be regarded as the equivalent of the differential first stage of a conventional operational amplifier circuit, and input stage 100 regarded as its second gain stage. The optimum gain of second gain stage 100 can then be determined by conventional design procedures.

Current steering circuits 200 and 300 and current mirrors 400 and 500 function as described in FIG. 2. The feedback and output signal currents from output terminals 603 and 604 are expressed by the equations $$I_{FB} = 2(I_{SIG})(1 + \exp[V_c/V_t]), \quad [33]$$

and $$I_{OUT} = \frac{2(I_{SIG})}{1 + \exp(V_c/V_t)}. \quad [34]$$

Summing equations [31] and [32] and simplifying, $$I_{OUT} + I_{FB} = 2(I_{SIG}). \quad [35]$$

The circuit of FIG. 6 operates as an inverting operational gain stage having a closed feedback loop. Thus, $$I_{FB} = -I_{IN}. \quad [36]$$

Substituting equation [34] in equation [33], $$I_{OUT} - I_{IN} = 2(I_{SIG}). \quad [37]$$

Substituting equation [35] in equation [32], $$I_{OUT} = \frac{I_{OUT} - I_{IN}}{1 + \exp(V_c/V_t)}. \quad [38]$$

Multiplying both sides of equation [36] by 1+exp ($V_c/V_t$), $$I_{OUT}(1 + \exp[V_c/V_t]) = I_{OUT} - I_{IN}. \quad [39]$$

Expanding equation [36] and simplifying, $$I_{OUT}(\exp[V_c/V_t]) = -I_{IN}. \quad [40]$$

Solving equation [38] for I $_{OUT}$, $$I_{OUT} = \frac{-I_{IN}}{\exp(V_c/V_t)}. \quad [41]$$

The above analysis shows that, while the circuit of FIG. 6 has an exponential control characteristic, all of the signal components (I $_{SIG}$, I $_{IN}$ and I $_{OUT}$) remain first order (linear) expressions.

In FIG. 6, the polarity of I $_{FB}$ is inverted with respect to I $_{IN}$. Since FIG. 6 includes the gain cell shown in block form in FIG. 1, I $_{OUT}$ is also inverted. In practice, it may be desirable to derive an output signal current which is non-inverted with respect to the input signal. It is considered obvious and within the scope of this invention that this may be accomplished by substituting the embodiment of the invention shown in block form in FIG. 3 for that of FIG. 1 in this embodiment of the invention.

Figure 7:
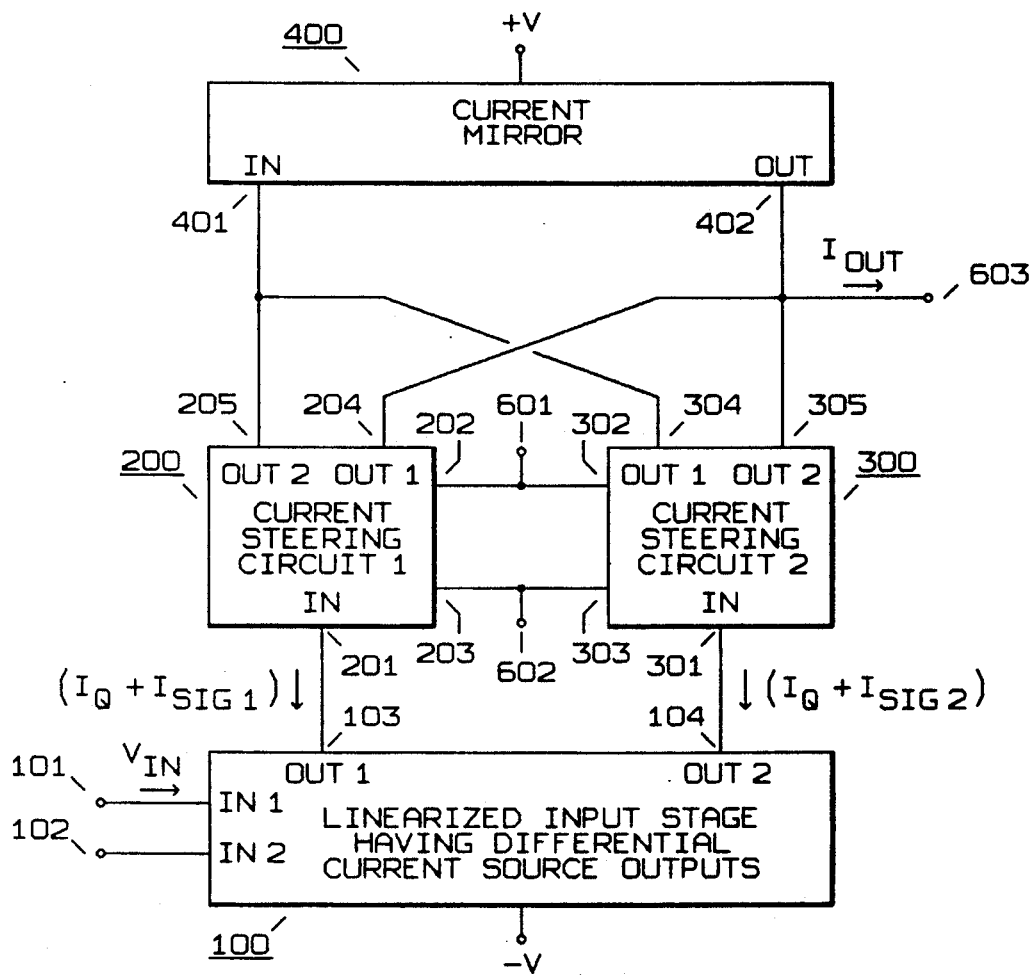
FIG. 7 is a block diagram of a fourth embodiment of the invention wherein the output terminals from the two current steering circuits of the improved gain cell of FIG. 1 are cross-coupled to realize an improved four quadrant multiplier.

FIG. 7 shows a block diagram of a fourth embodiment of the invention wherein the output terminals from the two current steering circuits of the improved gain cell of FIG. 1 are cross-coupled to realize an improved four quadrant multiplier.

In FIG. 7, first output terminal 204 of current steering circuit 200 is connected to second output terminal 305 of current steering circuit 300 and to output terminal 402 from current mirror 400 at system output terminal 603. Similarly, second output terminal 205 from current steering circuit 200 is connected to first output terminal 304 of current steering circuit 300 and to input terminal 401 of current mirror 400.

Figure 8:
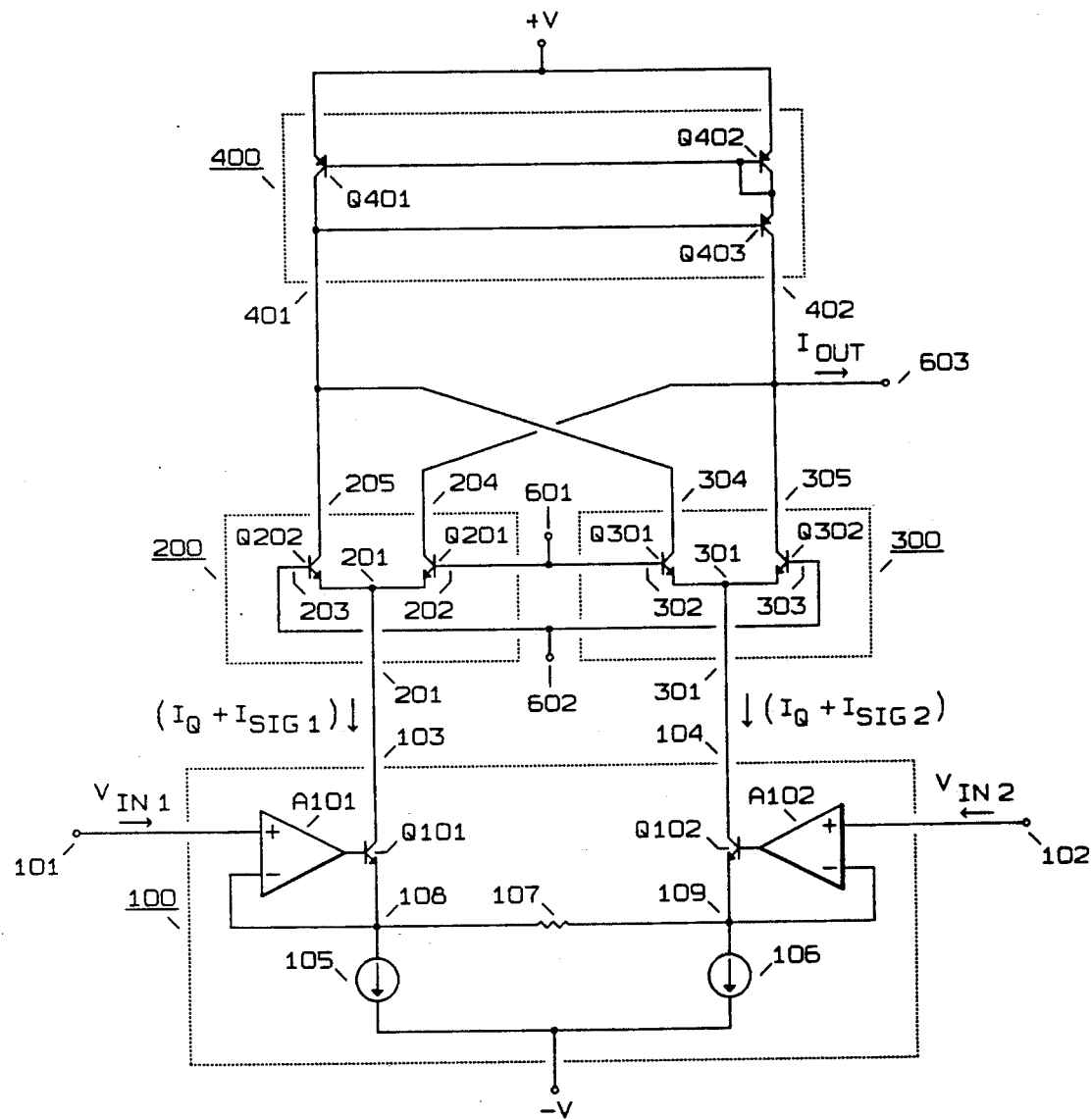
FIG. 8 is a schematic diagram showing a fourth preferred embodiment of the invention according to FIG. 7.

FIG. 8 shows a schematic of a preferred embodiment of the four quadrant multiplier described in block form in FIG. 7. In FIG. 8, the circuit is as described in FIG. 2, except that collector of Q201 is connected to the collector of Q302 and to output terminal 402 of current mirror 400 at system output terminal 603, and the collector of Q202 is connected to the collector of Q303 and to input terminal 401 of current mirror 400.

So connected, the signal at system output terminal 603 is described by the equation $$I_{OUT} = 2 \, (I_{SIG}) \left( 1 + \exp [V_c/V_t] - \frac{1}{1 + \exp [V_c/V_t]} \right). \quad [42]$$

In FIG. 2, FIG. 4, FIG. 6 and FIG. 8, preferably, the transistors comprising current steering circuits 200 and 300 are monolithic devices to ensure close device matching and thermal tracking and are large geometry devices or multiple, parallel devices to effect a low base resistance ($R_b$) to ensure low noise and good log conformity. It is further contemplated within the scope of this invention that current steering circuits 200 and 300 may comprise "effective transistors", each in turn comprising several transistor devices, as shown in, but not limited to, the examples shown in FIG. 9.

Figure 9A:
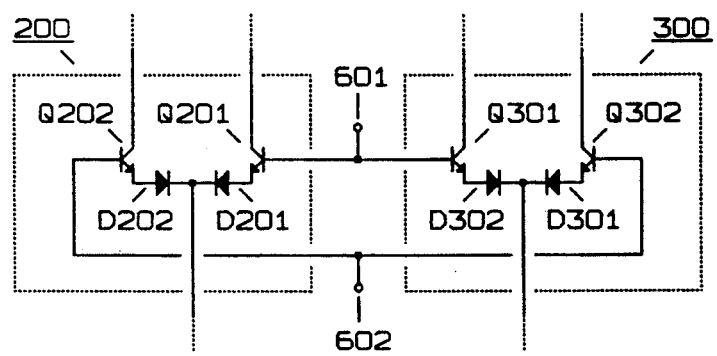
FIG. 9 is a schematic diagram showing the addition of (a) series diodes and (b) diode connected transistors to the current steering circuits to effect lower transconductance (prior art).
Figure 9B:
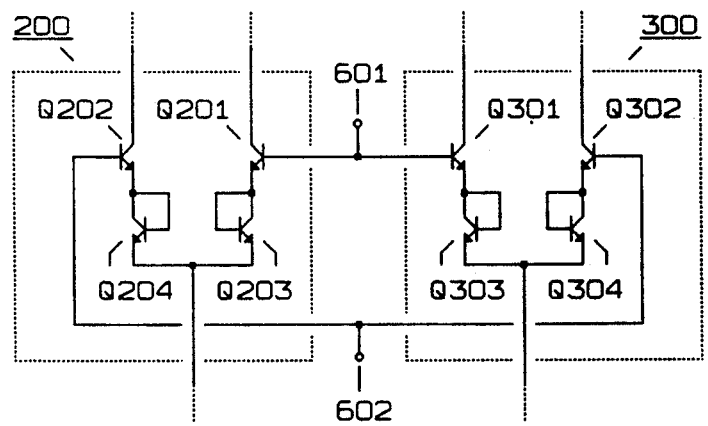

In FIG. 9 (a), a first, a second, a third and a fourth diode D201, D202, D301 and D302, respectively, are each placed in series with the b-e junction of respective transistors Q201, Q202, Q301 and Q302 to reduce the transconductance, and thereby the noise contribution, of each current steering circuit. In FIG. 9 (b), diode connected transistors Q203, Q204, Q303 and Q304 replace each of the diodes with the same effect.

In practice, an equal number of diodes or diode connected transistors greater than one may be placed in series with each transistor comprising each current steering circuit, resulting in further noise reduction. A further consequence of this technique is that the magnitude of $V_c$ is increased by the forward voltage of each such diode or diode connected transistor, but the principles of operation of the circuit are otherwise unchanged.

Figure 10:
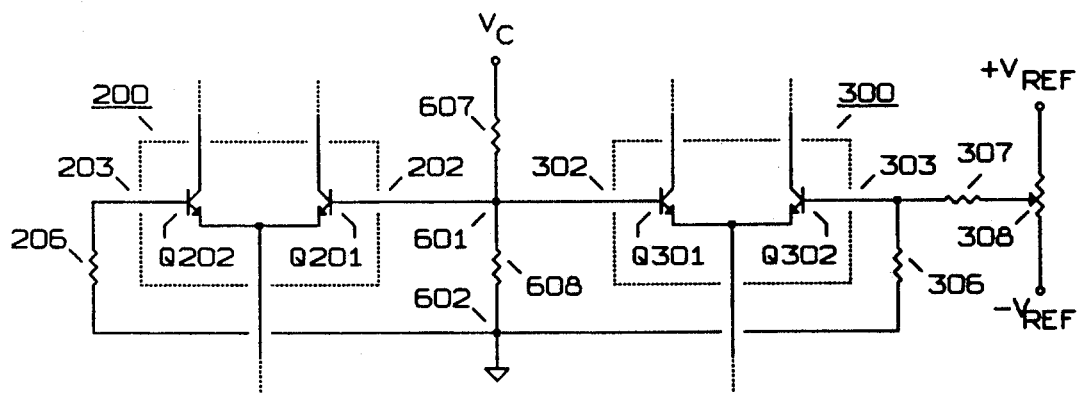
FIG. 10 is a schematic diagram showing a means to correct finite offsets between current steering circuits.

FIG. 10 shows a means to correct for finite offsets which may exist between the current steering circuits. In addition to the components previously described, the offset correction circuit of FIG. 10 comprises resistors 206, 306, 307, 607, 608, and potentiometer 308, which are added to the control circuit of the current steering circuits shown in FIG. 2, FIG. 4, FIG. 6 and FIG. 8.

In FIG. 10, a ground referenced control voltage $V_c$ is applied to one end of series input resistor 607, the other end of which is connected to system control terminal 601 and to one end of shunt resistor 608. The other end of resistor 608 is connected to ground. Control terminals 203 and 303 are connected to one end of resistors 206 and 306, respectively. One end of resistor 307 is connected to resistor 306 and control terminal 307. The other end of resistor 307 is connected to the wiper of potentiometer 308. One end of potentiometer 308 is connected to a positive reference voltage, and the other end is connected to a negative voltage. As potentiometer 308 is adjusted, the required correction voltage is applied to current steering circuit 300 through the divider formed by series resistor 307 and shunt resistor 306.

From minimum to maximum gain, the entire range of operation in these multipliers is controlled by a voltage equal to plus or minus the voltage drop across one or two b-e junctions. Thus, even seemingly small modulation by an external interference signal is a potential source of distortion in these circuits. To minimize this sensitivity, the control terminals typically are terminated by an impedance of 100 Ohms or less. To further reduce such modulation, as well as to reduce source induced offsets, it is desirable that control terminals 203, 204, 303 and 304 all be terminated by the same source impedance. This is accomplished by resistors making 206, 306 and 608 equal in value, while resistors 307 and 607 are comparatively very large. If resistors 206, 306 and 608 each equal 100 Ohms, and the reference voltages on potentiometer 308 are ±10 volts, then resistor 307 typically would be in the range of 25 to 50 Kohms, and resistor 607 would be in the range of 1.5 to 3 kOhms.

Figure 11:
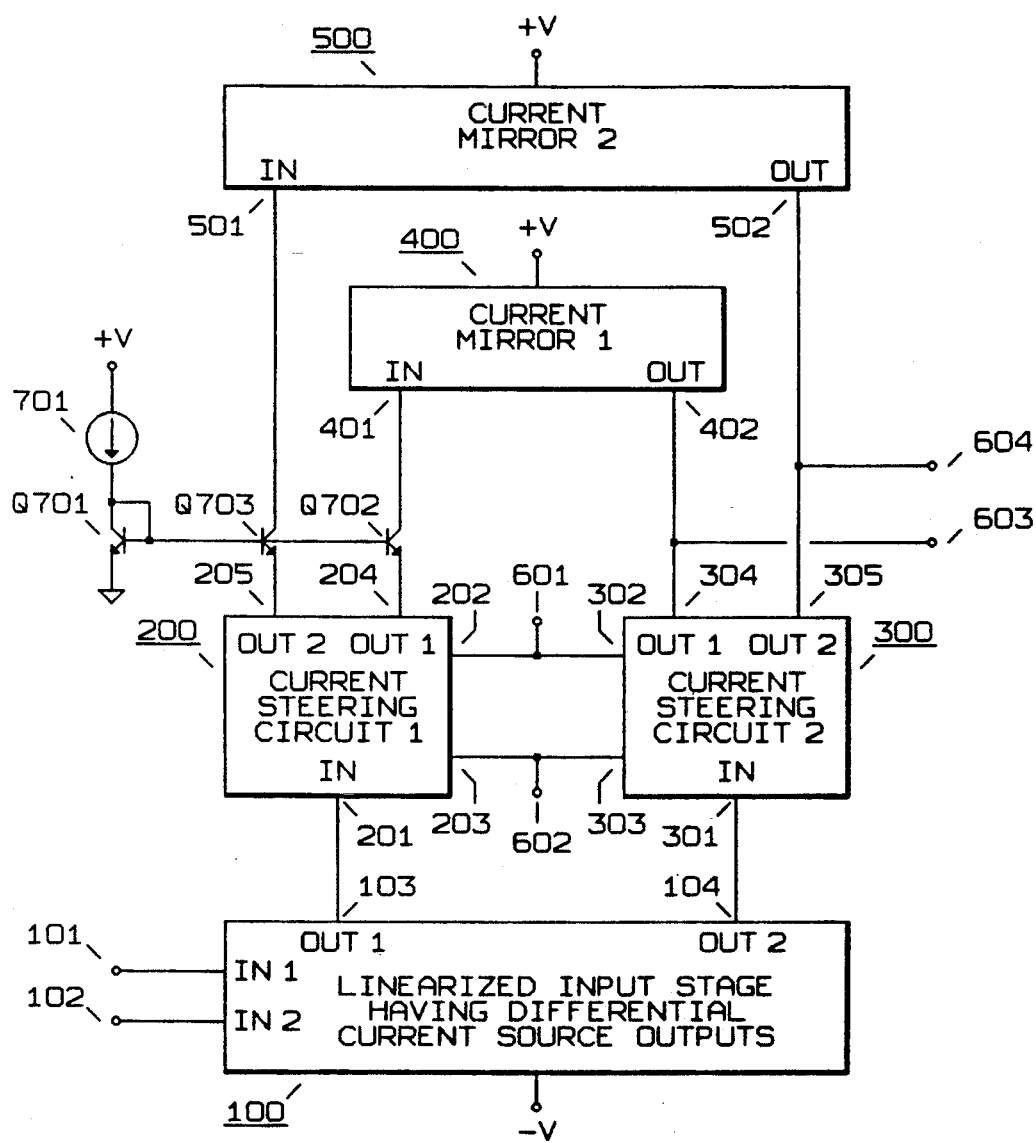
FIG. 11 is a schematic diagram showing the addition of cascode transistors to the block diagrams of the voltage controlled attenuators of FIG. 1 and FIG. 3 and the exponentially controlled multiplier of FIG. 5.

FIG. 11 shows the addition of a cascode transistor in series with the input terminal of each current mirror in the block diagram of the AGC multiplier shown in FIG. 1. In FIG. 11, output terminal 204 of current steering circuit 200 is connected to the emitter of cascode transistor Q702, and the collector of Q702 is connected to input terminal 401 of current mirror 400. Similarly, output terminal 205 of current steering circuit 200 is connected to the emitter of cascode transistor Q703, and the collector of Q703 is connected to input terminal 501 of current mirror 500. The collector of Q701 is connected to its base, to the bases of cascode transistors Q702 and Q703 and to one end of current source 701. The other end of current source 701 is connected to voltage source +V.

In operation, current from voltage source +V, through current source 701, biases diode connected transistor Q701 so that its base and the bases of Q702 and Q703 are held one b-e drop above ground. Thus, if Q701, Q702 and Q703 are matched, the emitters of Q702 and Q703 are also approximately at ground potential. As previously noted, output terminals 304 and 305 from current steering circuit 300 typically are connected to a virtual ground such as the summing junction of a ground referenced operational amplifier at system output terminals 603 and 604, respectively. The inclusion of cascode transistors Q702 and Q703 presents similar operating conditions to output terminals 204 and 205 of current steering circuit 200.

The embodiments of this invention shown in block form in FIG. 3 and FIG. 5 are applications of the basic gain cell shown in FIG. 1, wherein one of the system output terminals is connected to the ground referenced summing junction of the input stage. Therefore, the above description also applies to the addition of cascode transistors to these embodiments.

Figure 12:
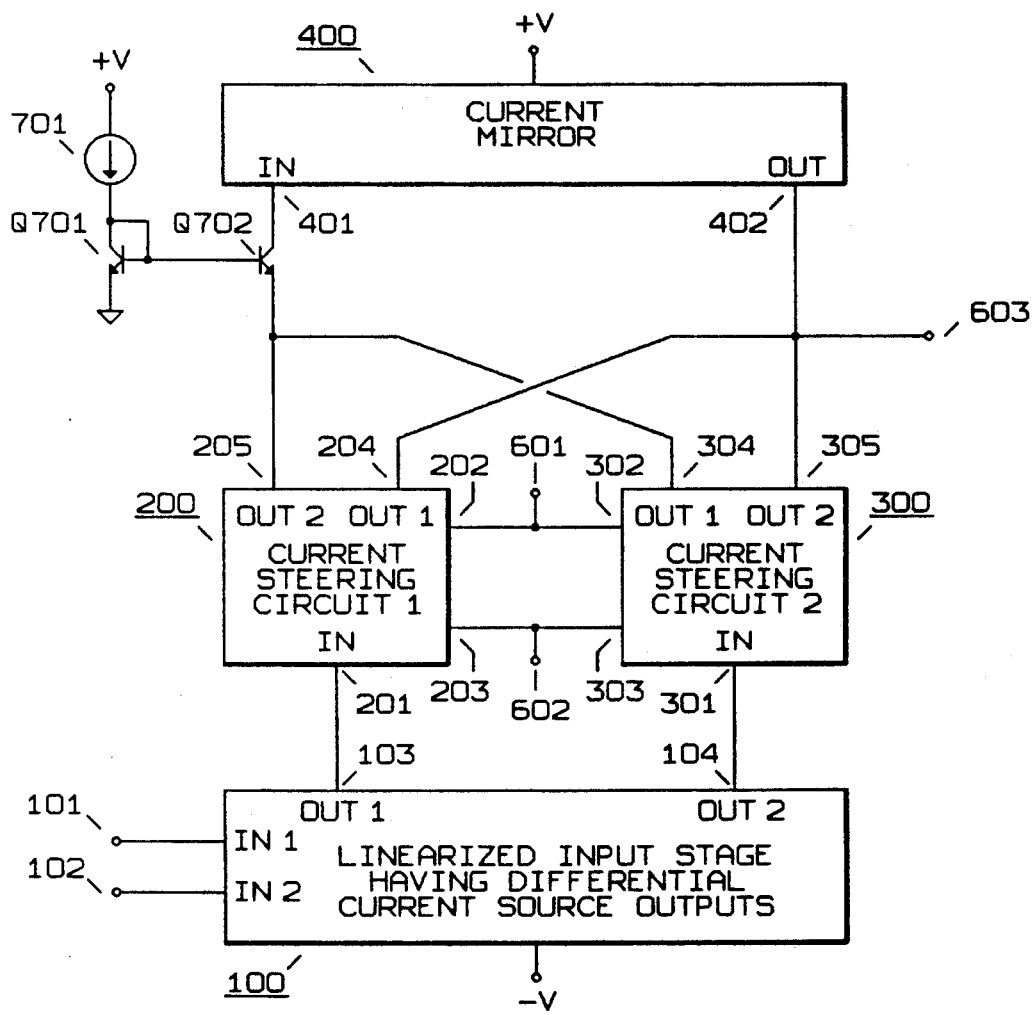
FIG. 12 is a schematic diagram showing the addition of a cascode connected transistor to the block diagram of the four quadrant multiplier of FIG. 7.

FIG. 12 shows the addition of a cascode transistor in series with the block diagram of the four quadrant multiplier shown in FIG. 7. In FIG. 12, as in FIG. 7, each output terminal from current steering circuit 200 is connected to a corresponding output terminal from current steering circuit 300, and only current mirror 400 is used. Therefore, only cascode transistor Q702 is required to create the desired ground referenced operating condition at the junction of output terminals 205 and 304. The operation of the cascode transistor is the same as previously described.

This invention may be embodied and practiced in other specific forms without departing from the spirit and essential characteristics thereof. Therefore, the present embodiments are to be considered in all respects as illustrative and not restrictive, the scope of the invention being indicated by the appended claims rather than by the foregoing description, and all variations, substitutions and changes which come within the meaning and range of equivalency of the claims are, therefore, intended to be embraced therein.

What is claimed is:

1. An electronic gain control system comprising:
   (a) an actively linearized input circuit, including at least one input terminal, adapted to receive an input signal and to provide, at a first and a second output terminal, a first and a second signal current, respectively, each of said signal currents being proportional to the input signal and equal in amplitude to, and opposite in polarity from, the other and having, in particular, unusually precise linearity with respect to the input signal over a wide range of amplitude and frequency, and to sum with each of said signal currents a D.C. bias current sufficient to hold said input circuit in conduction under all normal conditions of operation;
   (b) a first and a second differential current steering circuit, each being identical to the other and having an input terminal, a first and a second output terminal, and a first and a second control terminal;
   (c) a first and a second system gain control terminal adapted to receive a gain control signal applied there between;
   (d) a current mirror circuit having a gain of unity and having an input terminal and an output terminal, and
   (e) a system output terminal;
   wherein:
   (a) the first and second output terminals of said input circuit are connected to the input terminals of said first and second differential current steering circuits, respectively;
   (b) the first control terminals of said first and second differential current steering circuit are connected to each other and to a first system gain control terminal, and the second control terminals of said first and second differential current steering circuit are connected to each other and to a second system gain control terminal;
   (c) the first output terminal of said first differential current steering circuit is connected to the input terminal of said current mirror circuit;
   (d) the first output terminal of said second differential current steering circuit is connected to the output terminal of said current mirror circuit and also to said system output terminal, and
   (e) the second output terminals of said first and second current steering circuits are connected to signal common;
   whereby:
   said gain control system is enabled to provide, at said system output terminal, an output signal current which is proportional to the input signal and the amplitude of which is a function of the gain control signal applied between said first and second system gain control terminals.

2. An electronic gain control system according to claim 1 wherein said first differential current steering circuit comprises a first and a second bipolar transistor means, and said second differential current steering circuit comprises a third and a fourth bipolar transistor means, each of said bipolar transistor means having an emitter, a collector and a base, and all of said transistor means being of the same polarity,
   wherein:
   (a) the emitters of said first and second bipolar transistor means are connected together and to the input terminal of said first differential current steering circuit;
   (b) the emitters of said third and fourth bipolar transistor means are connected together and to the input terminal of said second differential current steering circuit;
   (c) the collectors of said first and second bipolar transistor means are connected to the first and second terminals of said first differential current steering circuit, respectively;
   (d) the collectors of said third and fourth bipolar transistor means are connected to the first and second output terminals of said second differential current steering circuit, respectively;
   (e) the bases of said first and second bipolar transistor means are connected to the first and second control terminals of said first differential current steering circuit, respectively, and
   (f) the bases of said third and fourth bipolar transistor means are connected to the first and second control terminals of said second differential current steering circuit, respectively;

3. An electronic gain control system according to claim 2 wherein each of said bipolar transistor means in each of said differential current steering circuits comprises multiple, parallel bipolar transistors, each having an emitter, a collector and a base.

4. An electronic gain control system according to claim 2 wherein each of said bipolar transistor means in each of said differential current steering circuits comprises a large geometry bipolar transistor, each having an emitter, a collector and a base.

5. An electronic gain control system according to claim 2 wherein an equal number of diode-connected transistors, each having an effective anode and an effective cathode, is connected in series with, and in the same polar orientation as, the emitter of each of said bipolar transistor means comprising each of said differential current steering circuits.

6. An electronic gain control system according to claim 5 wherein each of said bipolar transistor means in each of said differential current steering circuits comprises multiple, parallel bipolar transistors, each having an emitter, a collector and a base.

7. An electronic gain control system according to claim 5 wherein each of said bipolar transistor means in each of said differential current steering circuits comprises a large geometry bipolar transistor, each having an emitter, a collector and a base.

8. An electronic gain control system according to claim 2 wherein an equal number of diodes, each having an anode and a cathode, is connected in series with, and in the same polar orientation as, the emitter of each of said bipolar transistor means comprising each of said differential current steering circuits.

9. An electronic gain control system according to claim 8 wherein each of said bipolar transistor means in each of said differential current steering circuits comprises multiple, parallel bipolar transistors, each having an emitter, a collector and a base.

10. An electronic gain control system according to claim 8 wherein each of said bipolar transistor means in each of said differential current steering circuits comprises a large geometry bipolar transistor, each having an emitter, a collector and a base.

11. An electronic gain control system comprising:
  (a) an actively linearized input circuit, including at least one input terminal, adapted to receive an input signal and to provide, at a first and a second output terminal, a first and a second signal current, respectively, each of said signal currents being proportional to the input signal and equal in amplitude to, and opposite in polarity form, the other and having, in particular, unusually precise linearity with respect to the input signal over a wide range of amplitude and frequency, and to sum with each of said signal currents a D.C. bias current sufficient to hold said input circuit in conduction under all normal conditions of operation;
  (b) a first and a second differential current steering circuit, each being identical to the other and having an an input terminal, a first and a second output terminal, and a first and a second control terminal;
  (c) a first and a second system gain control terminal adapted to receive a gain control signal applied there between;
  (d) a first and a second current mirror circuit, each having a gain of unity, and each having an input terminal and an output terminal, and
  (e) a first and a second system output terminal;
wherein:
  (a) the first and second output terminals of said input circuit are connected to the input terminals of said first and second differential current steering circuits, respectively;
  (b) the first control terminals of said first and second differential current steering circuit are connected to each other and to a first system gain control terminal, and the second control terminals of said first and second differential current steering circuit are connected to each other and to a second system gain control terminal;
  (c) the first and second output terminals of said first differential current steering circuit are connected to the input terminals of said first and second current mirror circuits, respectively, and
  (d) the first and second output terminals of said second differential current steering circuit are connected to the output terminals of said first and second current mirror circuits, respectively, and also to said first and second system outputs terminal, respectively;
whereby:
  said gain control system is enabled to provide, at said first and second system output terminals, a first and a second output signal current, respectively, each of which is proportional to the input signal and of the same polarity as the other, and the respective amplitudes of which are complementary functions of the gain control signal applied between said first and second system gain control terminals.

12. An electronic gain control system according to claim 11 wherein said first differential current steering circuit comprises a first and a second bipolar transistor means, and said second differential current steering circuit comprises a third and a fourth bipolar transistor means, each of said bipolar transistor means having an emitter, a collector and a base, and all of said transistor means being of the same polarity, wherein:

(a) the emitters of said first and second bipolar transistor means are connected together and to the input terminal of i said first differential current steering circuit;
  (c) the collectors of said first and second bipolar transistor means are connected to the first and second output terminals of said first differential current steering circuit:
  (d) the collectors of said third and fourth bipolar transistor means are connected to the first and second output terminals of said second differential current steering circuit, respectively;
  (e) the bases of said first and second bipolar transistor means are connected to the first and second control terminals of said first differential current steering circuit, respectively, and
  (f) the bases of said third and fourth bipolar transistor means are connected to the first and second control terminals of said second differential current steering circuit, respectively;

13. An electronic gain control system according to claim 12 wherein each of said bipolar transistor means in each of said differential current steering circuits comprises multiple, parallel bipolar transistors, each having an emitter, a collector and a base.

14. An electronic gain control system according to claim 12 wherein each of said bipolar transistor means in each of said differential current steering circuits comprises a large geometry bipolar transistor, each having an emitter, a collector and a base.

15. An electronic gain control system according to claim 12 wherein an equal number of diode-connected transistors, each having an effective anode and an effective cathode, is connected in series with, and in the same polar orientation as, the emitter of each of said bipolar transistor means comprising each of said differential current steering circuits.

16. An electronic gain control system according to claim 15 wherein each of said bipolar transistor means in each of said differential current steering circuits comprises multiple, parallel bipolar transistors, each having an emitter, a collector and a base.

17. An electronic gain control system according to claim 15 wherein each of said bipolar transistor means in each of said differential current steering circuits comprises a large geometry bipolar transistor, each having an emitter, a collector and a base.

18. An electronic gain control system according to claim 15 wherein an equal number of diodes, each having an anode and a cathode, is connected in series with, and in the same polar orientation as, the emitter of each of said bipolar transistor means comprising each of said differential current steering circuits.

19. An electronic gain control system according to claim 18 wherein each of said bipolar transistor means in each of said differential current steering circuits comprises multiple, parallel bipolar transistors, each having an emitter, a collector and a base.

20. An electronic gain control system according to claim 18 wherein each of said bipolar transistor means in each of said differential current steering circuits comprises a large geometry bipolar transistor, each having an emitter, a collector and a base.

21. The electronic gain control system defined in claim 11 and further comprising an amplifier circuit, having substantial gain and including at least one input terminal, which is adapted to receive and to amplify the sum of an input signal current and a negative feedback signal current, and to provide an output signal which is proportional to said sum of said input and feedback signal currents;
wherein:
(a) the input signal current is applied to an input terminal of said amplifier circuit;
(b) the output signal from said amplifier circuit is applied as input to said gain control system such that the output signal current from the first system output terminal of said gain control system is inverted with respect to said input signal current, and
(c) the first system output terminal of said gain control system is connected to the input terminal of said amplifier circuit;
whereby:
said gain control system is enabled to provide, at said first and second system output terminals, a feedback signal current and an output signal current, respectively, which are proportional to, and inverted with respect to, the input signal current and the respective amplitudes of which are complementary functions of the gain control signal applied between said first and second system gain control terminals.

22. An electronic gain control system according to claim 21 wherein said first differential current steering circuit comprises a first and a second bipolar transistor means, and said second differential circuit steering circuit comprises a third and a fourth bipolar transistor means, each of said bipolar transistor means having an emitter, a collector and a base, and all of said transistor means being of the same polarity,
wherein:
(a) the emitters of said first and second bipolar transistor means are connected together and to the input terminal of said first differential current steering circuit;
(b) the emitters of said third and fourth bipolar transistor means are connected together and to the input terminal of said second differential current steering circuit;
(c) the collectors of said first and second bipolar transistor means are connected to the first and second output terminals of said first differential current steering circuit, respectively;
(d) the collectors of said third and fourth bipolar transistor means are connected to the first and second output terminals of said second differential current steering circuit, respectively;
(e) the bases of said first and second bipolar transistor means are connected to the first and second control terminals of said first differential current steering circuit, respectively, and
(f) the bases of said third and fourth bipolar transistor means are connected to the first and second control terminals of said second differential current steering circuit, respectively.

23. An electronic gain control system according to claim 22 wherein each of said bipolar transistor means in each of said differential current steering circuits comprises multiple, parallel bipolar transistors, each having an emitter, a collector and a base.

24. An electronic gain control system according to claim 22 wherein each of said bipolar transistor means in each of said differential current steering circuits comprises a large geometry bipolar transistor, each having an emitter, a collector and a base.

25. An electronic gain control system according to claim 22 wherein an equal number of diode-connected transistors, each having an effective anode and an effective cathode, is connected in series with, and in the same polar orientation as, the emitter of each of said bipolar transistor means comprising each of said differential current steering circuits.

26. An electronic gain control system according to claim 25 wherein each of said bipolar transistor means comprises multiple, parallel bipolar transistors, each having an emitter, a collector and a base.

27. An electronic gain control system according to claim 25 wherein each of said bipolar transistor means comprises a large geometry bipolar transistor, each having an emitter, a collector and a base.

28. An electronic gain control system according to claim 22 wherein an equal number of diodes, each having an anode and a cathode, is connected in series with, and in the same polar orientation as, the emitter of each of said bipolar transistor means comprising each of said differential current steering circuits.

29. An electronic gain control system according to claim 28 wherein each of said bipolar transistor means comprises multiple, parallel bipolar transistors, each having an emitter, a collector and a base.

30. An electronic gain control system according to claim 28 wherein each of said bipolar transistor means comprises a large geometry bipolar transistor, each having an emitter, a collector and a base.

31. An electronic gain control system comprising:
(a) an actively linearized input circuit, including at least one input terminal, adapted to receive an input signal and to provide, at a first and a second output terminal, a first and a second signal current, respectively, each of said signal currents being proportional to the input signal and equal in amplitude to, and opposite in polarity from, the other and having, in particular, unusually precise linearity with respect to the input signal over a wide range of amplitude and frequency, and to sum with each of said signal currents a D.C. bias current sufficient to hold said input circuit in conduction under all normal conditions of operation;
(b) a first and a second differential current steering circuit, each being identical to the other and having an input terminal, a first and a second output terminal, and a first and a second control terminal;
(c) a first and a second system gain control terminal adapted to receive a gain control signal applied there between;
(d) a first and a second current mirror circuit, each having a gain of unity, and each having an input terminal and an output terminal, and
(e) a first and a second system output terminal:
wherein:
(a) the first and second output terminals of said input circuit are connected to the input terminals of said first and second differential current steering circuits, respectively;
(b) the first control terminals of said first and second differential current steering circuit are connected to each other and to a first system gain control terminal, and the second control terminals of said first and second differential current steering circuit are connected to each other and to a second system gain control terminal;
(c) the first output terminal of said first differential current steering circuit and the second output terminal of said second differential current steering circuit are connected to the input terminals of said first and second current mirror circuits, respectively, and (d) the first output terminal of said second differential current steering circuit and the second output terminal of said first differential current steering circuit are connected to the output terminals of said first and second current mirror circuits, respectively, and also to said first and second system output terminals, respectively;

whereby:

said gain control system is enabled to provide, at said first and second system output terminals, a first and a second output signal current, respectively, each of which is proportional to the input signal and opposite in polarity from the other, and the respective amplitudes of which are complementary functions of the gain control signal applied between said first and second system gain control terminals.

32. An electronic gain control system according to claim 31 wherein said first differential current steering circuit comprises a first and a second bipolar transistor means, and said second differential current steering circuit comprises a third and a fourth bipolar transistor means, each of said bipolar transistor means having an emitter, a collector and a base, and all of said transistor means being of the same polarity, wherein:

(a) the emitters of said first and second bipolar transistor means are connected together and to the input terminal of said first differential current steering circuit;

(b) the emitters of said third and fourth bipolar transistor means are connected together and to the input terminal of said second differential current steering circuit;

(c) the collectors of said first and second bipolar transistor means are connected to the first and second output terminals of said first differential current steering circuit, respectively;

(d) the collectors of said third and fourth bipolar transistor means are connected to the first and second output terminals of said second differential current steering circuit, respectively;

(e) the bases of said first and second bipolar transistor means are connected to the first and second control terminals of said first differential current steering circuit, respectively, and (f) the bases of said third and fourth bipolar transistor means are connected to the first and second control terminals of said second differential current steering circuit, respectively.

33. An electronic gain control system according to claim 32 wherein each of said bipolar transistor means in each of said differential current steering circuits comprises multiple, parallel bipolar transistors, each having an emitter, a collector and a base.

34. An electronic gain control system according to claim 32 wherein each of said bipolar transistor means in each of said differential current steering circuits comprises a large geometry bipolar transistor, each having an emitter, a collector and a base.

35. An electronic gain control system according to claim 32 wherein an equal number of diode-connected transistors, each having an effective anode and an effective cathode, is connected in series with, and in the same polar orientation as, the emitter of each of said bipolar transistor means comprising each of said differential current steering circuits.

36. An electronic gain control system according to claim 35 wherein each of said bipolar transistor means in each of said differential current steering circuits comprises multiple, parallel bipolar transistors, each having an emitter, a collector and a base.

37. An electronic gain control system according to claim 35 wherein each of said bipolar transistor means in each of said differential current steering circuits comprises a large geometry bipolar transistor, each having an emitter, a collector and a base.

38. An electronic gain control system according to claim 32 wherein an equal number of diodes, each having an anode and a cathode, is connected in series with, and in the same polar orientation as, the emitter of each of said bipolar transistor means comprising each of said differential current steering circuits.

39. An electronic gain control system according to claim 38 wherein each of said bipolar transistor means in each of said differential current steering circuits comprises multiple, parallel bipolar transistors, each having an emitter, a collector and a base.

40. An electronic gain control system according to claim 38 wherein each of said bipolar transistor means in each of said differential current steering circuits comprises a large geometry bipolar transistor, each having an emitter, a collector and a base.

41. The electronic gain control system defined in claim 31 and further comprising an amplifier circuit, having substantial gain and including at least one input terminal, which is adapted to receive and to amplify the sum of an input signal current and a negative feedback signal current, and to provide an output signal which is proportional to said sum of said input and feedback signal currents;

wherein:

(a) the input signal current is applied to an input terminal of said amplifier circuit;

(b) the output signal from said amplifier circuit is applied as input to said gain control system such that the output signal current from the first system output terminal of said gain control system is inverted with respect to said input signal current, and (c) the first system output terminal of said gain control system is connected to the input terminal of said amplifier circuit;

whereby:

said gain control system is enabled to provide, at said first and second system output terminals, a feedback signal current and an output signal current, respectively, which are proportional to, and inverted and non-inverted, respectively, with respect to, the input signal current and the respective amplitudes of which are complementary functions of the gain control signal applied between said first and second system gain control terminals.

42. An electronic gain control system according to claim 41 wherein said first differential current steering circuit comprises a first and a second bipolar transistor means, and said second differential current steering circuit comprises a third and a fourth bipolar transistor means, each of said bipolar transistor means having an emitter, a collector and a base, and all of said transistor means being of the same polarity, wherein:

(a) the emitters of said first and second bipolar transistor means are connected together and to the input terminal of said first differential current steering circuit;

(b) the emitters of said third and fourth bipolar transistor means are connected together and to the input terminal of said second differential current steering circuit;

(c) the collectors of said first and second bipolar transistor means are connected to the first and second output terminals of said first differential current steering circuit, respectively;

(d) the collectors of said third and fourth bipolar transistor means are connected to the first and second output terminals of said second differential current steering circuit, respectively;

(e) the bases of said first and second bipolar transistor means are connected to the first and second control terminals of said first differential current steering circuit, respectively, and (f) the bases of said third and fourth bipolar transistor means are connected to the first and second control terminals of said second differential current steering circuit, respectively.

43. An electronic gain control system according to claim 42 wherein each of said bipolar transistor means in each of said differential current steering circuits comprises multiple, parallel bipolar transistors, each having an emitter, a collector and a base.

44. An electronic gain control system according to claim 42 wherein each of said bipolar transistor means in each of said differential current steering circuits comprises a large geometry bipolar transistor, each having an emitter, a collector and a base.

45. An electronic gain control system according to claim 42 wherein an equal number of diode-connected transistors, each having an effective anode and an effective cathode, is connected in series with, and in the same polar orientation as, the emitter of each of said bipolar transistor means comprising each of said differential current steering circuits.

46. An electronic gain control system according to claim 45 wherein each of said bipolar transistor means comprises multiple, parallel bipolar transistors, each having an emitter, a collector and a base.

47. An electronic gain control system according to claim 45 wherein each of said bipolar transistor means comprises a large geometry bipolar transistor, each having an emitter, a collector and a base.

48. An electronic gain control system according to claim 42 wherein an equal number of diodes, each having an anode and a cathode, is connected in series with, and in the same polar orientation as, the emitter of each of said bipolar transistor means comprising each of said differential current steering circuits.

49. An electronic gain control system according to claim 48 wherein each of said bipolar transistor means comprises multiple, parallel bipolar transistors, each having an emitter, a collector and a base.

50. An electronic gain control system according to claim 48 wherein each of said bipolar transistor means comprises a large geometry bipolar transistor, each having an emitter, a collector and a base.

51. An electronic gain control system comprising:

(a) an actively linearized input circuit, including at least one input terminal, adapted to receive an input signal and to provide, at a first and a second output terminal, a first and a second signal current, respectively, each of said signal currents being proportional to the input signal and equal in amplitude to, and opposite in polarity from, the other and having, in particular, unusually precise linearity with respect to the input signal over a wide range of amplitude and frequency, and to sum with each of said signal currents a D.C. bias current sufficient to hold said input circuit in conduction under all normal conditions of operation;

(b) a first and a second differential current steering circuit, each being identical to the other and having an input terminal, a first and a second output terminal, and a first and a second control terminal;

(c) a first and a second system gain control terminal adapted to receive a gain control signal applied there between;

(d) a current mirror circuit having a gain of unity and having an input terminal and an output terminal, and (e) a system output terminal;

wherein:

(a) the first and second output terminals of said input circuit are connected to the input terminals of said first and second differential current steering circuits, respectively;

(b) the first control terminals of said first and second differential current steering circuit are connected to each other and to a first system gain control terminal, and the second control terminals of said first and second differential current steering circuit are connected to each other and to a second system gain control terminal;

(c) the first output terminal of said first differential current steering circuit is connected to the second output terminal of said second current steering circuit and also to the input terminal of said current mirror circuit, and (d) the first output terminal of said second differential current steering circuit is connected to the second output terminal of said first current steering circuit, and also to the output terminal of said current mirror circuit, and also to said system output terminal;

whereby:

said gain control system is enabled to provide, at said system output terminal, an output signal current which is proportional to the input signal and the amplitude and polarity of which are functions of the gain control signal applied between said first and second system gain control terminals.

* * * * *

UNITED STATES PATENT AND TRADEMARK OFFICE
CERTIFICATE OF CORRECTION

PATENT NO. : 5,157,350
DATED : October 20, 1992
INVENTOR(S) : Harvey Rubens

It is certified that error appears in the above-indentified patent and that said Letters Patent is hereby corrected as shown below:

Column 5, Line 58:

Delete "is".

Column 3, Line 36,
Column 3, Line 68
and Column 4, Line 3:

Change "Db" to --dB--

Column 17, Line 35:

Change "601" to --605--.

Column 17, Line 56:

Change "sage" to --stage--.

FIG. 4: Drawings:

The line from output terminal 305 from gain cell 300 should continue through the junction with the line from the base of transistor Q503 to the collector of transistor Q501 in current mirror 500.

FIG. 5 and FIG. 6:

System output terminal labeled 603 should be labeled 604.

UNITED STATES PATENT AND TRADEMARK OFFICE
CERTIFICATE OF CORRECTION

PATENT NO. : 5,157,350
DATED : October 20, 1992
INVENTOR(S) : Harvey Rubens

Page 2 of 2

It is certified that error appears in the above-indentified patent and that said Letters Patent is hereby corrected as shown below:

FIG. 5 and FIG. 6:

The junction of the lines from output terminal 304 from gain cell 300 and output terminal 402 from current mirror 400 should be labeled 603.

FIG. 6:

Input terminal labeled 604 should be labeled 605.

Signed and Sealed this

Twenty-first Day of December, 1993

Attest:

BRUCE LEHMAN

Attesting Officer

Commissioner of Patents and Trademarks